United States Patent
Lee et al.

(10) Patent No.: US 10,937,503 B2
(45) Date of Patent: Mar. 2, 2021

(54) MEMORY DEVICE AND METHOD OF OPERATING THE SAME

(71) Applicant: SK hynix Inc., Gyeonggi-do (KR)

(72) Inventors: Un Sang Lee, Chungcheongbuk-do (KR); Chi Wook An, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/654,724

(22) Filed: Oct. 16, 2019

(65) Prior Publication Data

US 2020/0395077 A1    Dec. 17, 2020

(30) Foreign Application Priority Data

Jun. 17, 2019    (KR) .......................... 10-2019-0071793

(51) Int. Cl.
*G11C 16/10* (2006.01)
*G11C 16/34* (2006.01)
*G11C 11/56* (2006.01)
*G11C 16/04* (2006.01)

(52) U.S. Cl.
CPC .......... *G11C 16/10* (2013.01); *G11C 16/3459* (2013.01); *G11C 11/5628* (2013.01); *G11C 11/5671* (2013.01); *G11C 16/0483* (2013.01)

(58) Field of Classification Search
CPC ..... G11C 16/10; G11C 16/26; G11C 16/3459; G11C 16/0483; G11C 16/04; G11C 11/5671; G11C 11/56; G11C 11/5628
USPC ....................................... 365/185.22, 185.24
See application file for complete search history.

(56) References Cited

U.S. PATENT DOCUMENTS

| | | | | |
|---|---|---|---|---|
| 6,366,496 B1* | 4/2002 | Torelli | ................ | G11C 11/5621 365/185.19 |
| 7,656,710 B1* | 2/2010 | Wong | ..................... | G11C 16/12 365/185.19 |
| 7,813,188 B2* | 10/2010 | Won | .................... | G11C 11/5628 365/185.03 |
| 8,050,097 B2* | 11/2011 | Wang | ..................... | G11C 16/10 365/185.18 |

(Continued)

FOREIGN PATENT DOCUMENTS

| KR | 10-2015-0014705 | 2/2015 |
|---|---|---|
| KR | 10-2015-0063850 | 6/2015 |

*Primary Examiner* — Michael T Tran
(74) *Attorney, Agent, or Firm* — IP & T Group LLP

(57) ABSTRACT

A memory device may include: memory cells each having any one of first and second programmed states as a target programmed state; a peripheral circuit configured to perform a program operation so that each memory cell has a threshold voltage corresponding to the target programmed state; and a control circuit configured to control the peripheral circuit. The control circuit may include a program operation controller configured to control the peripheral circuit so that, during the program operation, an intermediate program operation is performed on the memory cells using an intermediate verify voltage, an additional program operation is performed on memory cells each having the second programmed state as a target programmed state if an intermediate verify operation passes, and a final program operation is performed on the memory cells such that each memory cell has a threshold voltage corresponding to the target programmed state.

19 Claims, 16 Drawing Sheets

(56) References Cited

U.S. PATENT DOCUMENTS

| | | | | |
|---|---|---|---|---|
| 8,787,093 B2* | 7/2014 | Komatsu | G11C 11/5628 | 365/185.22 |
| 9,543,001 B1* | 1/2017 | Lee | G11C 11/5628 | |
| 9,543,002 B2* | 1/2017 | Tanaka | G11C 13/0021 | |
| 10,242,734 B1* | 3/2019 | Khakifirooz | G11C 16/3418 | |
| 2010/0142284 A1* | 6/2010 | Bathul | G11C 11/5628 | 365/185.19 |
| 2013/0301351 A1* | 11/2013 | Dutta | G11C 16/3427 | 365/185.02 |
| 2015/0043274 A1* | 2/2015 | Liu | G11C 11/5678 | 365/163 |
| 2016/0103763 A1* | 4/2016 | Chen | G11C 7/1084 | 711/154 |
| 2016/0148695 A1* | 5/2016 | Kim | G11C 29/42 | 365/185.03 |
| 2017/0117055 A1* | 4/2017 | Kim | G11C 16/26 | |
| 2018/0211715 A1* | 7/2018 | Cho | G11C 16/3481 | |
| 2018/0225220 A1* | 8/2018 | Lee | G06F 15/785 | |
| 2019/0006016 A1* | 1/2019 | Khakifirooz | G11C 16/10 | |
| 2019/0043563 A1* | 2/2019 | Khakifirooz | G11C 11/5642 | |
| 2019/0057751 A1* | 2/2019 | Lee | G11C 16/08 | |
| 2019/0066818 A1* | 2/2019 | Lee | G11C 8/08 | |
| 2019/0180831 A1* | 6/2019 | Shukla | G11C 29/52 | |
| 2019/0189215 A1* | 6/2019 | Yang | G11C 16/24 | |
| 2019/0287635 A1* | 9/2019 | Lee | G11C 16/10 | |
| 2019/0294362 A1* | 9/2019 | Lee | G11C 16/32 | |
| 2019/0318792 A1* | 10/2019 | Yang | G11C 16/26 | |
| 2019/0348122 A1* | 11/2019 | Ko | G11C 16/0483 | |
| 2019/0355408 A1* | 11/2019 | Shin | G11C 11/4091 | |
| 2019/0355429 A1* | 11/2019 | Chen | G11C 16/0483 | |
| 2019/0362799 A1* | 11/2019 | Yang | G11C 16/3459 | |
| 2019/0371406 A1* | 12/2019 | Yang | G11C 16/10 | |
| 2020/0020404 A1* | 1/2020 | Kim | G11C 8/08 | |
| 2020/0211663 A1* | 7/2020 | Baraskar | G11C 16/08 | |
| 2020/0265897 A1* | 8/2020 | Lu | G11C 11/5635 | |
| 2020/0321058 A1* | 10/2020 | Lee | G11C 16/30 | |

* cited by examiner

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0071793, filed on Jun. 17, 2019, which is incorporated herein by reference in its entirety.

BACKGROUND

Field of Invention

Various embodiments of the present disclosure relate to an electronic device, and more particularly, to a memory device and a method of operating the same.

Description of Related Art

Semiconductor memory devices are embodied using a semiconductor such as silicon (Si), germanium (Ge), gallium arsenide (GaAs), indium phosphide (InP), or the like. Generally, there are two types of memory devices: volatile memory devices and nonvolatile memory devices.

In a volatile memory device data stored therein is lost when power is interrupted. Representative examples of the volatile memory devices include a static RAM (SRAM), a dynamic RAM (DRAM), and a synchronous DRAM (SDRAM). In contrast, a nonvolatile memory device retains data stored therein even when power is interrupted. Representative examples of the nonvolatile memory devices include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). A flash memory may be a NOR type or a NAND type.

SUMMARY

Various embodiments of the present disclosure are directed to a memory device having enhanced reliability, and a method of operating the memory device.

An embodiment of the present disclosure may provide a method of operating a memory device configured to perform a program operation of storing data in memory cells each having, as a target programmed state, any one programmed state of a first programmed state and a second programmed state that are adjacent to each other among a plurality of programmed states, the method including: performing an intermediate program operation on the memory cells using an intermediate verify voltage having a voltage level less than a verify voltage corresponding to the first program state; performing an additional program operation of applying an additional program voltage to memory cells each having the second program state among the memory cells; and performing a final program operation for the memory cells to have a threshold voltage corresponding to a target program state, wherein a threshold voltage of a memory cell corresponding to the first program state is less than a threshold voltage of a memory cell corresponding to the second program state.

An embodiment of the present disclosure may provide a method of operating a semiconductor memory device configured to perform a program operation of storing data in memory cells each having any one programmed state among a plurality of programmed states as a target programmed state, the method including: performing an intermediate program operation for the memory cells to have threshold voltages corresponding to a plurality of corresponding intermediate program states for every two program states having adjacent threshold voltage distributions among the plurality of program states; performing an additional program operation of applying an additional program voltage to memory cells each having a program state of the two program states that corresponds to a high threshold voltage distribution; and performing a final program operation for the memory cells to have the threshold voltages included in the corresponding threshold voltage distributions.

An embodiment of the present disclosure may provide a memory device including: a plurality of memory cells each having any one of a first program state and a second program state that are adjacent to each other among a plurality of program states; a peripheral circuit configured to perform a program operation for each of the plurality of memory cells to have a threshold voltage corresponding to a target program state; and a control circuit configured to control the peripheral circuit, wherein the control circuit comprises: a program operation controller configured to control the peripheral circuit, during the program operation, to perform an intermediate program operation on the memory cells using an intermediate verify voltage having a voltage level less than a verify voltage corresponding to the first program state, to perform an additional program operation on memory cells each having the second program state among the memory cells if an intermediate verify operation using the intermediate verify voltage passes, and to perform a final program operation on the memory cells such that each of the memory cells has a threshold voltage corresponding to a target program state.

An embodiment of the present disclosure may provide a memory device including: a memory cell array including a plurality of memory cells; a peripheral circuit coupled to the memory cell array; and a controller suitable for controlling the peripheral circuit to program memory cells to have any of (n) target program states, wherein the controller: programs each of the memory cells to have (n/2) intermediate program states, each intermediate program state corresponding to two adjacent target program states among the (n) target program states; programs the memory cells to have (n) intermediate program states, the (n) intermediate program states including pairs of adjacent intermediate program states, wherein intermediate program states of each pair overlap; and programs the memory cells to have the (n) target program states, each of the (n) target program states being differentiated from adjacent target program states.

DETAILED DESCRIPTION

Figure 1:
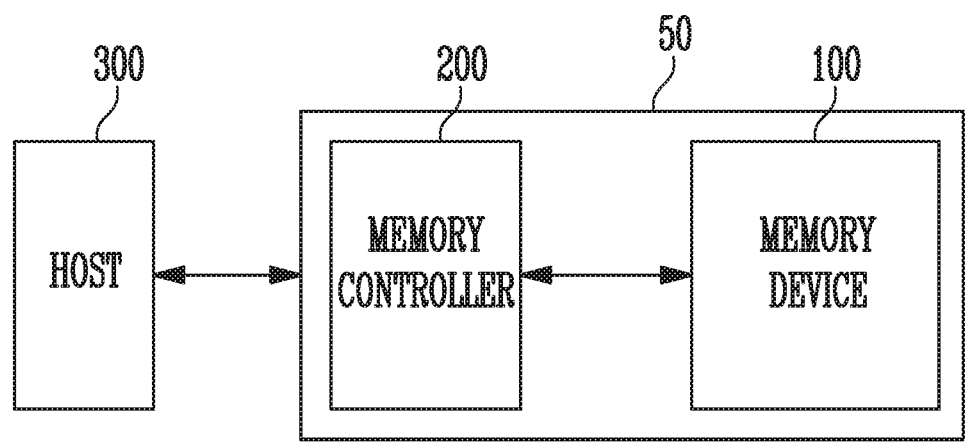
FIG. 1 is a diagram illustrating a storage device including a memory device in accordance with an embodiment of the present disclosure.

Specific structural and functional description provided herein is directed to embodiments of the present disclosure. The present invention, however, is not limited to the embodiments described herein.

While embodiments are described in detail, the present invention is not limited to any specific detail. The present disclosure may be embodied in many different forms and should not be construed as being limited to any specific description. Rather, the present invention should be construed to cover not only the disclosed embodiments, but also various alternatives, modifications, equivalents and other embodiments that fall within the spirit and scope of the present disclosure.

It will be understood that, although the terms "first", "second", etc. may be used herein to identify various elements, these elements should not be limited by these terms. These terms are only used to distinguish one element from another element that otherwise have the same or similar names. A first element in one instance could be termed a second element in another instance without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that open ended terms, such as "comprise", "include", "have", etc., when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art may be omitted to avoid obscuring the subject matter of the present disclosure. This aims to omit unnecessary description so as to make the subject matter of the present disclosure clear.

Various embodiments of the present disclosure are described more fully below with reference to the accompanying drawings, in which preferred embodiments of the present disclosure are shown, so that those skilled in the art can easily carry out and practice the present disclosure.

FIG. 1 is a diagram illustrating a storage device 50 including a memory device in accordance with an embodiment of the present disclosure.

Referring to FIG. 1, the storage device 50 may include a memory device 100 and a memory controller 200.

The storage device 50 may be configured to store data under control of a host 300 such as a cellular phone, a smartphone, an MP3 player, a laptop computer, a desktop computer, a game machine, a television (TV), a tablet personal computer (PC), or an in-vehicle infotainment system.

The storage device 50 may be implemented as any of various kinds of storage devices depending on a host interface, which is a communication system with the host 300. For example, the storage device 50 may be configured as any of various kinds of storage devices, such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-e or PCIe) type storage device, a compact flash (CF) card, a smart media card, and/or a memory stick.

The storage device 50 may be manufactured in the form of any of various package types. For instance, the storage device 50 may be manufactured as a package on package (POP) type, a system in package (SIP) type, a system on chip (SOC) type, a multi-chip package (MCP) type, a chip on board (COB) type, a wafer-level fabricated package (WFP) type, and/or a wafer-level stack package (WSP) type.

The memory device 100 may store data therein. The memory device 100 may operate under control of the memory controller 200. The memory device 100 may include a memory cell array including a plurality of memory cells configured to store data therein. The memory cell array may include a plurality of memory blocks. Each memory block may include a plurality of memory cells. The memory block may be the unit of erasing data stored in the memory device 100. In an embodiment, the memory block may include a plurality of pages. The page may be the unit of storing data in the memory device 100, or reading data from the memory device 100.

In an embodiment, the memory device 100 may be a double data rate synchronous dynamic random access memory (DDR SDRAM), a low power double data rate4 (LPDDR4) SDRAM, a graphics double data rate (DDDR) SDRAM, a low power DDR (LPDDR), a ramous dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, by way of example, it is assumed that the memory device 100 is a NAND flash memory.

In an embodiment, the memory device 100 may be embodied in a three-dimensional array structure. The present disclosure may be applied not only to a flash memory in which a charge storage layer is formed of a conductive floating gate (FG), but also to a charge trap flash (CTF) memory in which a charge storage layer is formed of an insulating layer.

In an embodiment, each of the memory cells in the memory device 100 may be operated in the form of a single level cell (SLC) capable of storing a single bit of data, a multi-level cell (MLC) capable of storing two bits of data, a triple-level cell (TLC) capable of storing three bits of data, or a quad-level cell (QLC) capable of storing four bits of data.

The memory device 100 may receive a command and an address from the memory controller 200 and access an area of the memory cell array that is selected by the address. In other words, the memory device 100 may perform an operation corresponding to the command on the area selected by the address. For example, the memory device 100 may perform a program operation, a read operation, and an erase operation. During a program operation, the memory device 100 may store data in a memory cell area selected by an address. During a read operation, the memory device 100 may read stored data from the memory cell area selected by the address. During an erase operation, the memory device 100 may erase data from a memory cell area selected by an address.

The memory controller 200 may control overall operations of the storage device 50. When power is applied to the storage device 50, the memory controller 200 may execute firmware (FW). In the case where the memory device 100 is a flash memory device, the memory controller 200 may execute firmware such as a flash translation layer (FTL) for controlling communication between the host 300 and the memory device 100.

If a write request is received from the host 300, the memory controller 200 may receive from the host 300 data to be stored and a logical address for identifying the corresponding data. The memory controller 200 may translate the input logical address into a physical address for indicating physical addresses of memory cells in which data is to be stored among the memory cells in the memory device 100. The memory controller 200 may provide, to the memory device 100, a program command for storing data, a translated physical address, and data to be stored.

In an embodiment, if a read request is received from the host 300, the memory controller 200 may receive, from the host 300, a logical address for identifying data to be read. The memory controller 200 may obtain a physical address corresponding to the input logical address, and provide a read command and a physical address to the memory device 100.

In an embodiment, during an erase operation, the memory controller 200 may provide an erase command and a physical address to the memory device 100.

In an embodiment, the memory controller 200 may autonomously control the memory device 100 to perform a program operation, a read operation, or an erase operation regardless of a request from the host 300. For example, the memory controller 200 may control the memory device 100 to perform background operations such as a wear leveling operation, a garbage collection operation, and a read reclaim operation.

The host 300 may communicate with the storage device 50 using at least one of various communication methods, such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and/or load reduced DIMM (LRDIMM) communication methods.

Figure 2:
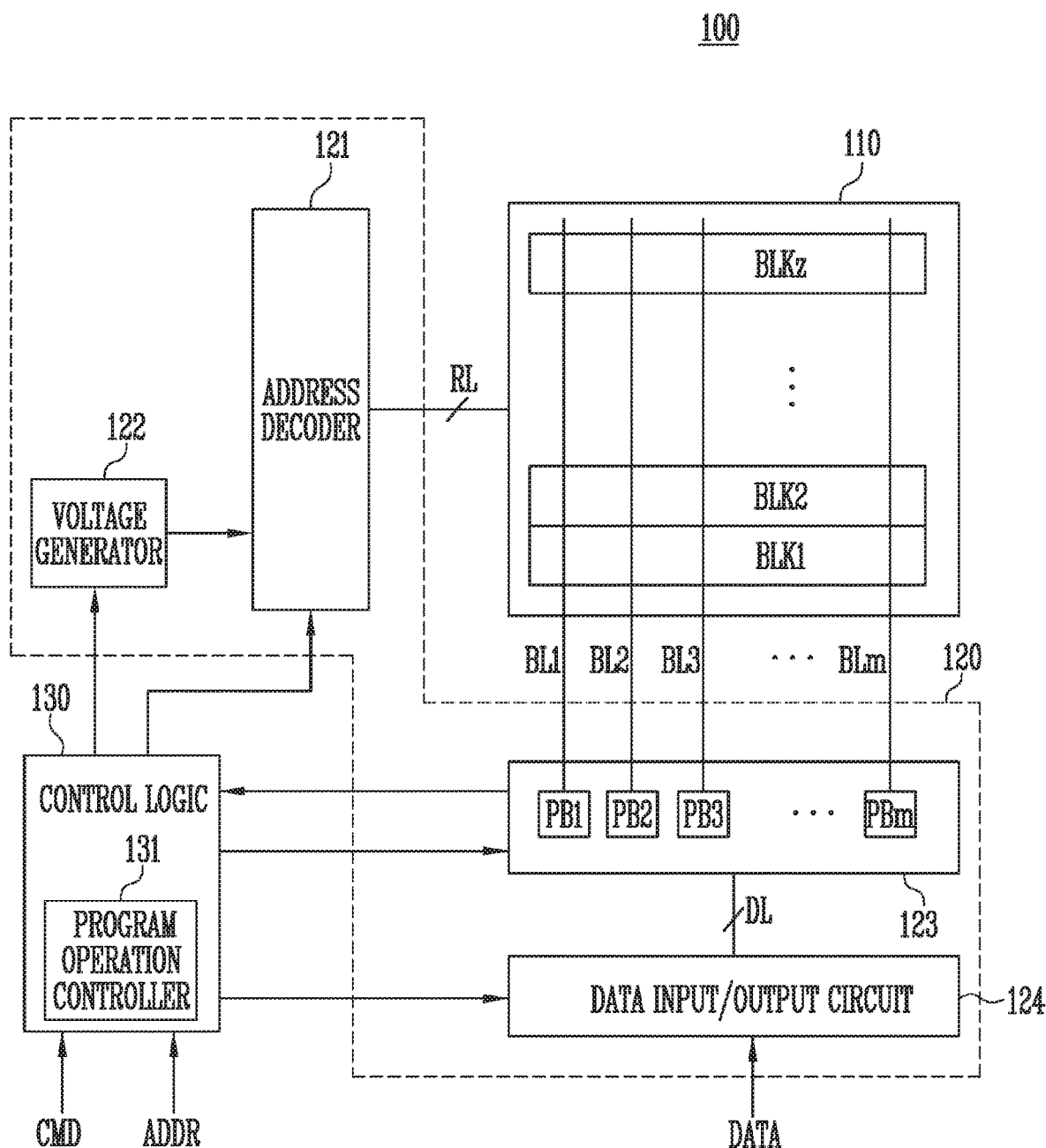
FIG. 2 is a block diagram illustrating a structure of the memory device of FIG. 1.

FIG. 2 is a block diagram illustrating the structure of the memory device 100 of FIG. 1.

Referring to FIG. 2, the memory device 100 may include a memory cell array 110, a peripheral circuit 120, and control logic 130. The peripheral circuit 120 may include an address decoder 121, a voltage generator 122, a read and write (read/write) circuit 123, and a data input and output (input/output) circuit 124.

The memory cell array 110 may include a plurality of memory blocks BLK1 to BLKz. The memory blocks BLK1 to BLKz are connected to the address decoder 121 through row lines RL and connected to the read/write circuit 123 through bit lines BL1 to BLm. The memory blocks BLK1 to BLKz are coupled in common to first to m-th bit lines BL1 to BLm. Each of the memory blocks BLK1 to BLKz may include a plurality of memory cells.

In an embodiment, the plurality of memory cells may be nonvolatile memory cells. The row lines RL may include at least one source select line, a plurality of word lines, and at least one drain select line. Memory cells coupled to the same word line may be defined as one page. Hence, each memory block may include a plurality of pages.

Each of the memory cells in the memory cell array 110 may be formed as a single level cell (SLC) capable of storing a single bit of data, a multi-level cell (MLC) capable of storing two bits of data, a triple-level cell (TLC) capable of storing three bits of data, or a quad-level cell (QLC) capable of storing four bits of data.

The peripheral circuit 120 may perform a program operation, a read operation, or an erase operation on a selected area of the memory cell array 110 under control of the control logic 130. The peripheral circuit 120 may drive the memory cell array 110. For example, the peripheral circuit 120 may apply various operating voltages to the row liens RL and the first to m-th bit lines BL1 to BLm or discharge the applied voltages, under control of the control logic 130.

The address decoder 121 may be coupled to the cell array 110 through the row lines RL. The address decoder 121 may operate under control of the control logic 130. The address decoder 121 may receive addresses from the control logic 130. In an embodiment, the address decoder 121 may decode a block address among the received addresses, and select at least one of the memory blocks BLK1 to BLKz according to the decoded address. In an embodiment, the address decoder 121 may decode a row address among the received addresses, and select any one word line of the selected memory block.

The address decoder 121 may select row lines RL corresponding to the selected memory block and transmit operating voltages generated by the voltage generator 122 to the selected row lines RL.

During a program operation, the address decoder 121 may apply a program voltage to a selected word line and apply a program pass voltage having a level lower than that of the program voltage to unselected word lines. During a program verify operation, the address decoder 121 may apply a verify voltage to a selected word line and apply a verify pass voltage higher than the verify voltage to unselected word lines. During a read operation, the address decoder 121 may apply a read voltage to a selected word line and apply a read pass voltage higher than the read voltage to unselected word lines.

In an embodiment, an erase operation of the memory device 100 may be performed on a memory block basis. During an erase operation, the address decoder 121 may select one memory block in response to a decoded address. During the erase operation, the address decoder 121 may apply a ground voltage to word lines coupled to the selected memory block.

In an embodiment, the address decoder 121 may include an address buffer, a block decoder, and a row decoder.

The voltage generator 122 may generate a plurality of voltages using an external supply voltage provided to the semiconductor memory device 100. The voltage generator 122 may operate under control of the control logic 130. For example, the voltage generator 122 may generate an internal supply voltage by regulating the external power voltage. The internal supply voltage generated by the voltage generator 122 may be applied to the address decoder 121, the read/write circuit 123, the data input/output circuit 124, the control logic 130, and a program operation controller 131, and thus used as an operating voltage of the memory device 100.

For example, the voltage generator 122 may generate a program voltage, a verify voltage, a pass voltage, a program pass voltage, a verify pass voltage, a read voltage, an erase voltage, and the like under control of the control logic 130.

In an embodiment, the voltage generator 122 may include a plurality of pumping capacitors to generate a plurality of operating voltages Vop having various voltage levels. The voltage generator 122 may selectively enable the plurality of pumping capacitors in response to control of the control logic 130 to generate a plurality of operating voltages. The generated operating voltages may be supplied to the memory cell array 110 by the address decoder 121.

The read/write circuit 123 may include first to math page buffers PB1 to PBm, which may be coupled to the memory cell array 110 through the first to math bit lines BL1 to BLm, respectively. The first to math page buffers PB1 to PBm may operate under control of the control logic 130. For example, the first to m-th page buffers PB1 to PBm may operate in response to page buffer control signals (not illustrated).

In an embodiment, the first to math page buffers PB1 to PBm may sense data stored in the memory cell array 110 by sensing voltage or current of the first to math bit lines BL1 to BLm. The first to math page buffers PB1 to PBm may temporarily store the sensed data. The first to math page buffers PB1 to PBm may provide the sensed data to the data input/output circuit 124 through the data lines DL.

In an embodiment, the first to math page buffers PB1 to PBm may receive data to be stored in the memory cell array 110, from the data input/output circuit 124 through data lines DL. The data received to the first to math page buffers PB1 to PBm by performing a program operation may be stored in the memory cell array 110.

The program operation of storing data in memory cells may include a program voltage application step and a verify step. At the program voltage application step, while a program voltage is applied to a selected word line, the first to math page buffers PB1 to PBm may transmit, to selected memory cells, data to be stored. Threshold voltages of memory cells coupled to a bit line to which a program enable voltage (for example, a ground voltage) is applied may be increased. Threshold voltages of memory cells coupled to a bit line to which a program inhibit voltage (for example, a supply voltage) is applied may be retained. At the program verify step of verifying the program operation, the first to math page buffers PB1 to PBm may sense data from selected memory cells through the first to m-th bit lines BL1 to BLm.

The data input/output circuit 124 may be coupled to the first to m-th page buffers PB1 to PBm through the data lines DL. The data input/output circuit 124 may operate under control of the control logic 130.

The data input/output circuit 124 may provide data DATA received from the memory controller 200 of FIG. 1 to the read/write circuit 123.

In an embodiment, the data input/output circuit 124 may include a plurality of input/output buffers (not shown) for receiving data DATA. During a program operation, the data input/output circuit 124 may receive data DATA to be stored from the memory controller 200. During a read operation, the data input/output circuit 124 may output, to the memory controller 200, the data received from the first to m-th page buffers PB1 to PBm in the read/write circuit 123.

The control logic 130 may control overall operations of the memory device 100. The control logic 130 may receive a command CMD and an address ADDR.

In an embodiment, the control logic 130 may further include a program operation controller 131 configured to control a program operation. Although FIG. 2 illustrates that the program operation controller 131 is included in the control logic 130, the present disclosure is not limited thereto. In various embodiments, the program operation controller 131 may be provided external to the control logic 130.

The program operation may store data in a selected page defined by a selected word line. The program operation may be performed in multiple iterations, i.e., a plurality of program loops. Each program loop may include applying a program voltage, and verifying a result of the program operation. At each program loop iteration, the level of the program voltage to be applied to the selected word line may increase by a set step voltage, which may be predetermined. This scheme is referred to as incremental step pulse program (ISPP) scheme.

In the case where a memory cell stores k-bit data, the threshold voltage of the memory cell may belong to a threshold voltage distribution corresponding to any one of $2^k$ program states. If k is 3 or more, in other words, if the number of program states to which the threshold voltage of the memory cell may belong is 8 or more, a program operation may be divided into two sub-program operations rather than a single program operation for $2^k$ program states performed at the same time.

For example, the program operation may be divided into an intermediate program operation and a final program operation. The intermediate program operation may perform the program operation so that the threshold voltage of the memory cell belongs to any of half of $2^k$ program states depending on data to be stored in the corresponding memory cell. The final program operation may perform a program operation so that the threshold voltage of the corresponding memory cell belongs to a threshold voltage distribution corresponding to a target program state.

In an embodiment, the program operation controller 131 may control the peripheral circuit 120 to perform a first program operation and a second program operation on memory cells coupled to a selected word line, in response to a program command provided from the memory controller 200 described with reference to FIG. 1.

In an embodiment, the first program operation may include an intermediate program operation and an additional program operation. The second program operation may be a final program operation.

The intermediate program operation may perform a program operation so that threshold voltages of memory cells have, as target program states, a first program state or a second program state, which have adjacent threshold voltage distributions among a plurality of program states. Each of the first program state and the second program state are included in a threshold voltage distribution corresponding to an intermediate program state. Here, a verify voltage to be used during an intermediate verify operation may be lower than a verify voltage of the first program state. The intermediate verify operation may verify whether the intermediate program operation has been completed.

If the number of memory cells having threshold voltages higher than an intermediate verify voltage among memory cells having the first program state and the second program state is greater than a set number, the intermediate verify operation may pass. If the number of memory cells having threshold voltages higher than the intermediate verify voltage among the memory cells having the first program state or the second program state as the target program state is less than or equal to the preset number, the intermediate verify operation may fail.

If the intermediate verify operation passes, the program operation controller 131 may determine that the intermediate program operation has been completed. If the intermediate program operation for the memory cells having the first program state and the second program state is completed, the program operation controller 131 may control the peripheral circuit 120 to perform an additional program operation.

The additional program operation may apply an additional program voltage to memory cells having the second program state as a target program state among the memory cells having the first program state or the second program state as the target program state.

In an embodiment, during an additional program operation, an additional verify operation of verifying whether the additional program operation has been completed may be omitted.

In an embodiment, the level of the additional program voltage may be increased by a step voltage compared to the level of the program voltage applied before the intermediate program operation is completed.

While the additional program voltage is applied, a program inhibit voltage may be applied to bit lines coupled to the memory cells having the first program state as a target program state. In an embodiment, the program verify voltage may have the level of the power supply voltage (e.g., Vcc).

If the additional program operation is completed, the program operation controller 131 may control the peripheral circuit 120 to perform the second program operation. The second program operation may be the above-mentioned final program operation. The second program operation may increase the threshold voltage so that each of the memory cells has a threshold voltage corresponding to a target program state.

In various embodiments, the intermediate program operation and the final program operation each may be performed in a double verify program (DPGM) scheme. In accordance with the double verify program (DPGM) scheme, a verify operation may be performed using two verify voltages for each program state. For example, each of the intermediate program state, the first program state, or the second program state may have a pre-verify voltage and a main verify voltage. The pre-verify voltage may be less than the main verify voltage. In the case where the intermediate program operation is performed in the DPGM scheme, the main verify voltage corresponding to the intermediate program state may be equal to the intermediate verify voltage.

In an embodiment, while a program voltage is applied to a selected word line, a program enable voltage may be applied to a bit line coupled with a memory cell having a threshold voltage less than the pre-verify voltage during a verify operation. For example, the program allowable voltage may be a ground voltage (GND), e.g., 0V. In an embodiment, while a program voltage is applied to a selected word line, a program control voltage may be applied to a bit line coupled with a memory cell having a threshold voltage greater than the pre-verify voltage and less than the main verify voltage during a verify operation. The program control voltage may have a voltage greater than the ground voltage and less than the supply voltage. While a program voltage is applied to a selected word line, a program inhibit voltage may be applied to a bit line coupled with a memory cell having a threshold voltage greater than the main verify voltage during a verify operation.

In an embodiment, while the additional program operation is performed, the voltage of a bit line coupled with memory cells having the second program state as a target program state may be maintained at a voltage that was applied during the intermediate program operation in a preceding program loop. For example, while the additional program operation is performed, a program enable voltage may be applied to a bit line coupled to a memory cell to which a program enable voltage was applied during the intermediate program operation. While the additional program operation is performed, a program control voltage may be applied to a bit line coupled to a memory cell to which a program control voltage was applied during the intermediate program operation.

In this specification, various features are described in the context of TLCs, each capable of storing 3-bit data, is described by way of example. The present disclosure, however, is not limited to memory cells which are programmed in a TLC scheme.

Figure 3:
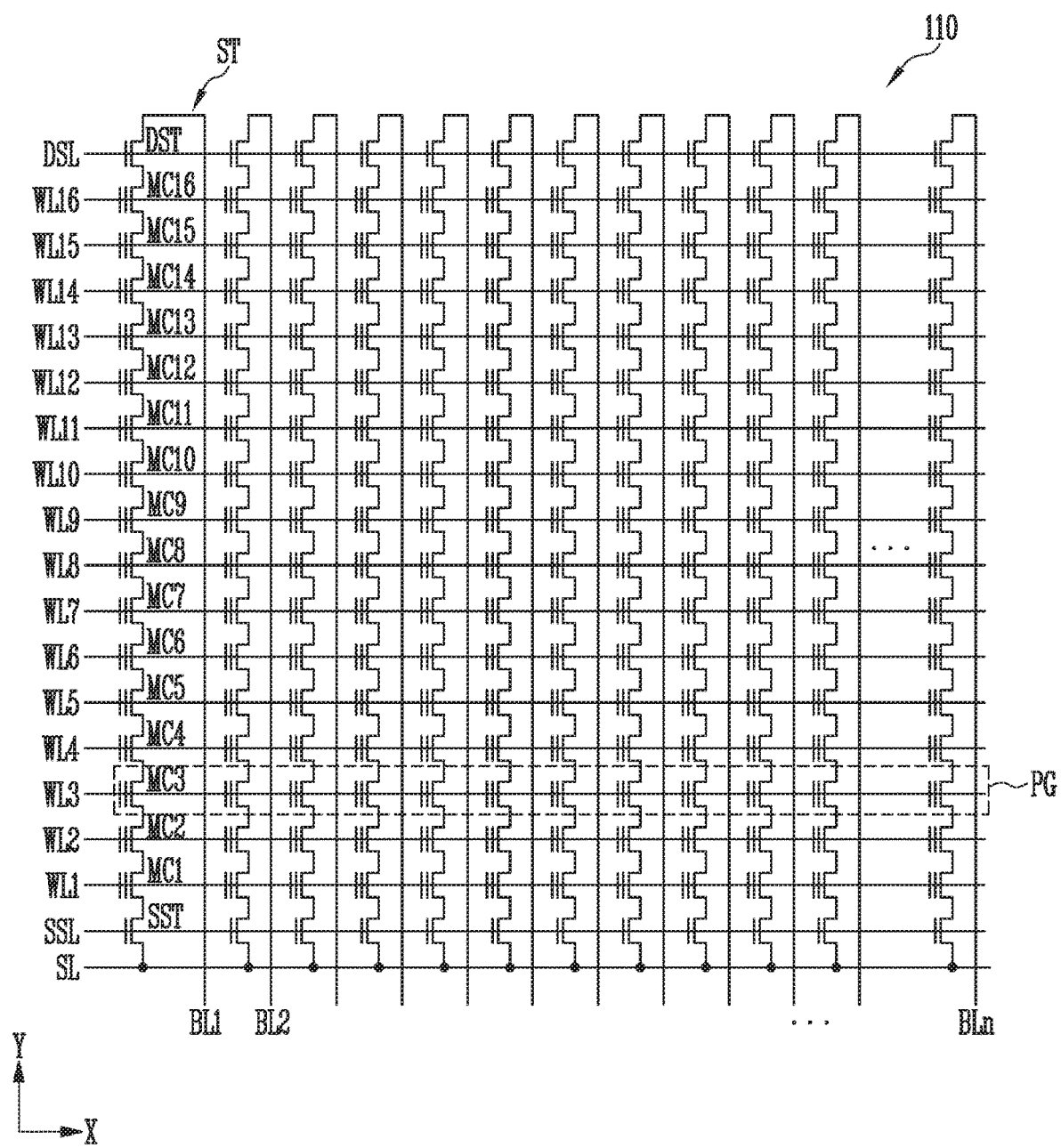
FIG. 3 is a diagram illustrating a structure of a representative memory block of a plurality of memory blocks BLK1 to BLKz of FIG. 2.

FIG. 3 is a diagram illustrating the structure of a representative memory block 110 of a plurality of memory blocks BLK1 to BLKz of FIG. 2.

Referring to FIG. 3, in the memory block 110, a plurality of word lines arranged parallel to each other may be coupled between a first select line and a second select line. The first select line may be a source select line SSL, and the second select line may be a drain select line DSL. In more detail, the memory block 110 may include a plurality of strings ST coupled between the bit lines BL1 to BLn and the source line SL. The bit lines BL1 to BLn may be first to m-th bit lines BL1 to BLm of FIG. 2. The bit lines BL1 to BLn may be respectively coupled to the strings ST, and the source lines SL may be coupled in common to the strings ST. The strings ST may have the same configuration; therefore, the string ST that is coupled to the first bit line BL1 is described in detail by way of example.

The string ST may include a source select transistor SST, a plurality of memory cells MC1 to MC16, and a drain select transistor DST which are coupled in series to each other between the source line SL and the first bit line BL1. At least one source select transistor SST and at least one drain select transistor DST may be included in each string ST, and more than sixteen memory cells, i.e., MC1 to MC16, shown in the drawing may be included in each string ST.

A source of the source select transistor SST may be coupled to the source line SL, and a drain of the drain select transistor DST may be coupled to the first bit line BL1. The memory cells MC1 to MC16 may be coupled in series between the source select transistor SST and the drain select transistor DST. Gates of the source select transistors SST in different strings ST may be coupled to the source select line SSL. Gates of the drain select transistors DST may be coupled to the drain select line DSL. Gates of the memory cells MC1 to MC16 may be coupled to the plurality of word lines WL1 to WL16. Among the memory cells in different strings ST, a group of memory cells coupled to each word line may be referred to as a physical page PG. Therefore, the number of physical pages PG in the memory block 110 may correspond to the number of word lines WL1 to WL16. The source line SL, the source select line SSL, the word lines WL1 to WL16, and the drain select line DSL may be included in the row lines RL of FIG. 2.

In the case where each memory cell is a single level cell (SLC) capable of storing one bit of data, each physical page PG may store one logical page (LPG) of data. Each memory cell may store two or more bits of data. In this case, each physical page PG may store two or more LPGs of data.

The drain select line DSL, the first to sixteenth word lines WL1 to WL16, and the source select line SSL are included in the row lines RL described with reference to FIG. 2. The drain select line DSL, the first to sixteenth word lines WL1 to WL16, and the source select line SSL are controlled by the address decoder 121. The common source line CSL is controlled by the control logic 130.

Figure 4:
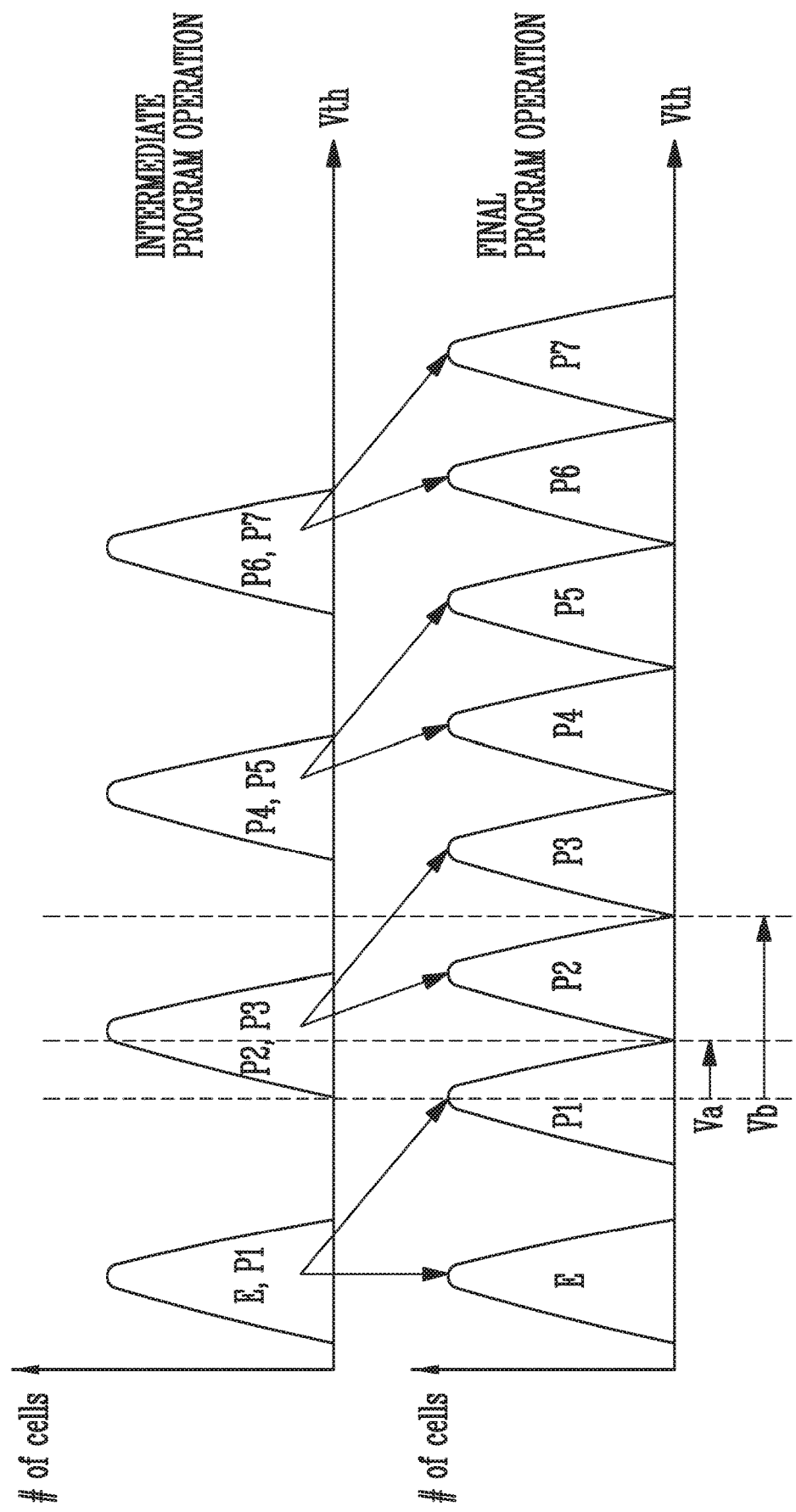
FIG. 4 is a diagram illustrating conventional intermediate program operation and final program operation.

FIG. 4 is a diagram illustrating a conventional intermediate program operation and final program operation.

Each of the memory cells may have an erased state E or any one of first to seventh program states P1 to P7 as a target program state. The target program state may be determined depending on data to be stored in the memory cell.

During an intermediate program operation, a program operation may be performed on memory cells having program states corresponding to adjacent threshold voltage distributions as target program states such that each of the memory cells has a single intermediate program state. For example, if the intermediate program operation is performed, each memory cell having an erased state E or a first program state P1 as a target program state may have a threshold voltage corresponding to a first intermediate program state. Each memory cell having a second program state P2 or a third program state P3 as a target program state may have a threshold voltage corresponding to a second intermediate program state. Each memory cell having a fourth program state P4 or a fifth program state P5 as a target program state may have a threshold voltage corresponding to a third intermediate program state. Each memory cell having a sixth program state P6 or a seventh program state P7 as a target program state may have a threshold voltage corresponding to a fourth intermediate program state P4.

After the intermediate program operation has been completed, a final program operation may be performed on each memory cell such that the memory cell has a threshold voltage of the corresponding target program state.

In FIG. 4, each of the memory cells programmed to the second intermediate program state may have either the second program state P2 or the third program state P3 as a target program state. During the final program operation, a program operation may be performed on each of the memory cells programmed to the second intermediate program state such that each memory cell has a threshold voltage corresponding to either the second program state P2 or the third program state P3. In the case of each of the memory cells having the second program state P2 as a target program state among the memory cells programmed to the second intermediate program state, the threshold voltage thereof is required to increase by Va during the final program operation. In the case of each of the memory cells having the third program state P3 as a target program state among the memory cells programmed to the second intermediate program state, the threshold voltage thereof is required to increase by Vb during the final program operation. Therefore, although memory cells have the same threshold voltage after the intermediate program operation has been completed, the levels by which the threshold voltages of the memory cells must be increased during the final program operation may differ from each other depending on target program states. Therefore, when the final program operation is completed, the widths of the threshold voltage distributions corresponding to the second program state P2 and the third program state P3 may differ from each other. This may cause reduction in reliability of data stored in the memory device or deterioration in efficiency of the program operation.

Figure 5:
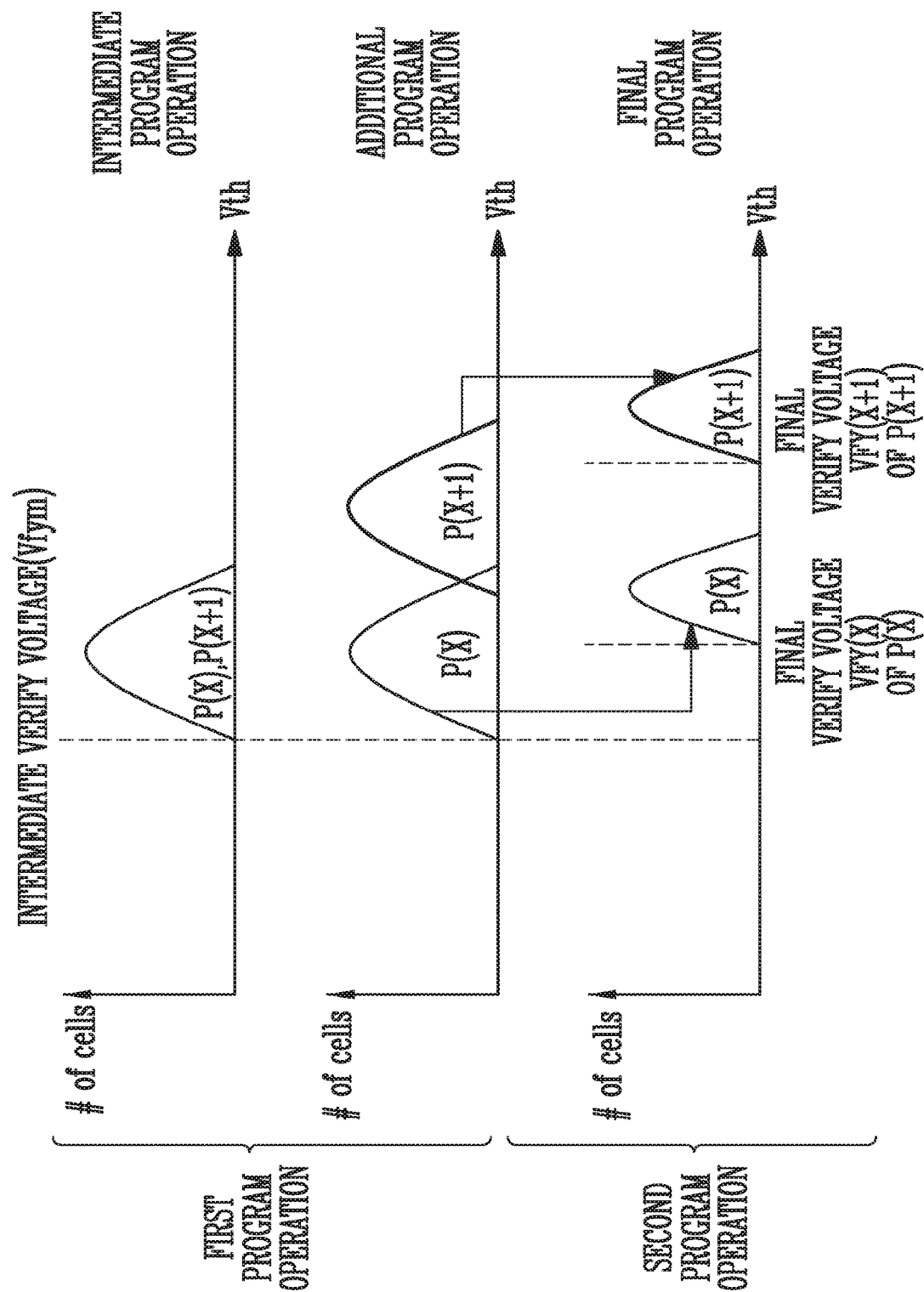
FIG. 5 is a diagram illustrating a program operation in accordance with an embodiment of the present disclosure.

FIG. 5 is a diagram illustrating a program operation in accordance with an embodiment of the present disclosure.

Referring to FIG. 5, the program operation may include a first program operation and a second program operation.

In an embodiment, the first program operation may include an intermediate program operation and an additional program operation. The second program operation may be a final program operation.

The intermediate program operation may perform a program operation so that threshold voltages of memory cells have a first program state P(x) or a second program state P(x+1) as target program state. The first program state P(x) and the second program state P(x+1) have adjacent threshold voltage distributions among a plurality of program states. The first program state P(x) and the second program state P(x+1) are included in a threshold voltage distribution corresponding to an intermediate program state. Here, an intermediate verify voltage Vfym to be used during an intermediate verify operation may be less than a verify voltage Vfy(x) of the first program state P(x). The intermediate verify operation may include an operation of verifying whether the intermediate program operation has been completed.

The additional program operation may apply an additional program voltage to memory cells having the second program state P(x+1) as a target program state among the memory cells having the first program state P(x) and the second program state P(x+1). In an embodiment, the level of the additional program voltage may be increased by a step voltage compared to the level of the program voltage that was applied before the intermediate program operation is completed.

While the additional program voltage is applied, a program inhibit voltage may be applied to bit lines coupled to the memory cells having the first program state P(x) as the target program state. While the additional program voltage is applied, a program enable voltage may be applied to bit lines coupled to the memory cells having the second program state P(x+1) as the target program state. Due to the application of the additional program voltage, the threshold voltage of the memory cells having the second program state P(x+1) as a target program state may be increased to a value greater than the threshold voltage of the memory cells having the first program sate P(x) as a target program state.

The second program operation may be a final program operation. The second program operation may increase the threshold voltage so that each of the memory cells has a threshold voltage corresponding to a target program state. If the second program operation is performed, the threshold voltage of the memory cells having the first program state P(x) as a target program state may have a voltage greater than a final verify voltage Vfy(x) of the first program state P(x). The threshold voltage of the memory cells having the second program state P(x+1) as a target program state may have a voltage greater than a final verify voltage Vfy(x+1) of the second program state P(x+1).

In an embodiment, the memory cells having the second program state P(x+1) as a target program state may have a threshold voltage greater than that of the memory cells having the first program state P(x) as a target program state after the first program operation has been completed. The memory cells having the first program state P(x) as a target program state and the memory cells having the second program state P(x+1) as a target program state may have threshold voltages increased by similar voltage levels while the second program operation is performed. Therefore, compared to the case of FIG. 4, the width of the threshold voltage distribution of the memory cells may be further reduced, and the margin of the read operation may be secured, whereby the reliability of the memory device may be enhanced.

Figure 6:
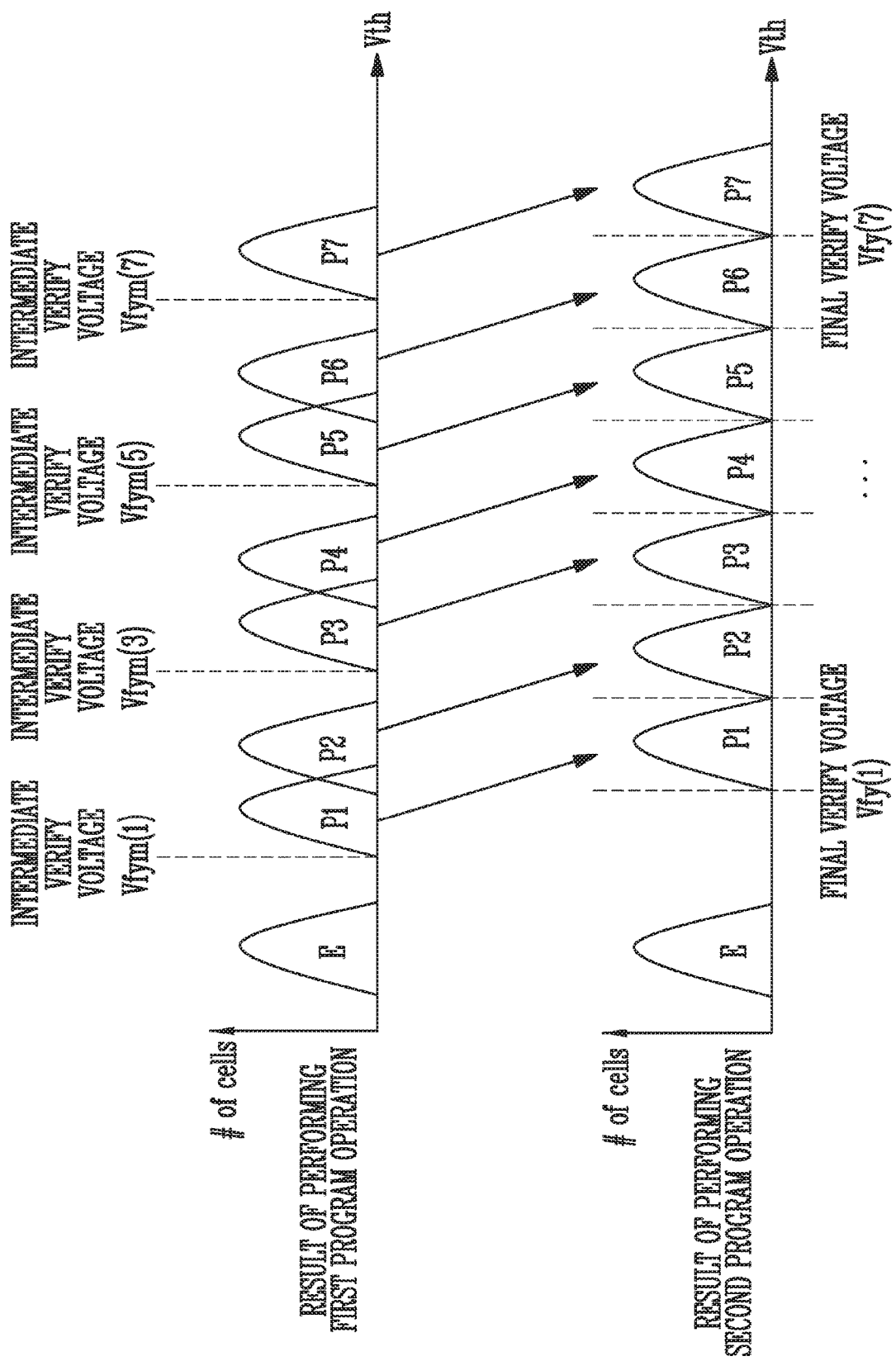
FIG. 6 is a diagram illustrating variation in threshold voltage distribution of memory cells during a program operation in accordance with an embodiment of the present disclosure.

FIG. 6 is a diagram illustrating variation in threshold voltage distribution of memory cells during a program operation in accordance with an embodiment of the present disclosure.

Referring to FIG. 6, a program operation may be performed on the memory cells such that each of the memory cells has a threshold voltage corresponding to any one of an erase state E and first to seventh program states P1 to P7.

A first program operation may include an intermediate program operation and an additional program operation.

The intermediate program operation may be performed on memory cells having the first program state P1 and the second program state P2 as target program states so that each of the memory cells has a threshold voltage greater than an intermediate verify voltage Vfym(1). The intermediate program operation may be performed on memory cells having the third program state P3 and the fourth program state P4 as target program states so that each of the memory cells has a threshold voltage greater than an intermediate verify voltage Vfym(3). The intermediate program operation may be performed on memory cells having the fifth program state P5 and the sixth program state P6 as target program states so that each of the memory cells has a threshold voltage greater than an intermediate verify voltage Vfym(5). An intermediate program operation may be performed on memory cells having the seventh program state P7 as a target program state so that each of the memory cells has a threshold voltage greater than an intermediate verify voltage Vfym(7).

The additional program operation may be performed on memory cells having, as target program states, the second program state P2, the fourth program state P4, and the sixth program state P6 that correspond to higher threshold voltage distributions among adjacent threshold voltage distributions. Therefore, a threshold voltage distribution of memory cells after the additional program operation has been performed may have the same form as a result of performing the first program operation of FIG. 6.

The second program operation may be performed such that each of the memory cells has a threshold voltage corresponding to a target program state. The memory cells having the first program state P1 as a target program state may have a threshold voltage greater than a final verify voltage Vfy(1). The memory cells having the second program state P2 as a target program state may have a threshold voltage greater than a final verify voltage Vfy(2). Likewise, the memory cells having the third to seventh program states P3 to P7 as target program states may have threshold voltages higher than final verify voltages Vfy(3) to Vfy(7), respectively.

Figure 7:
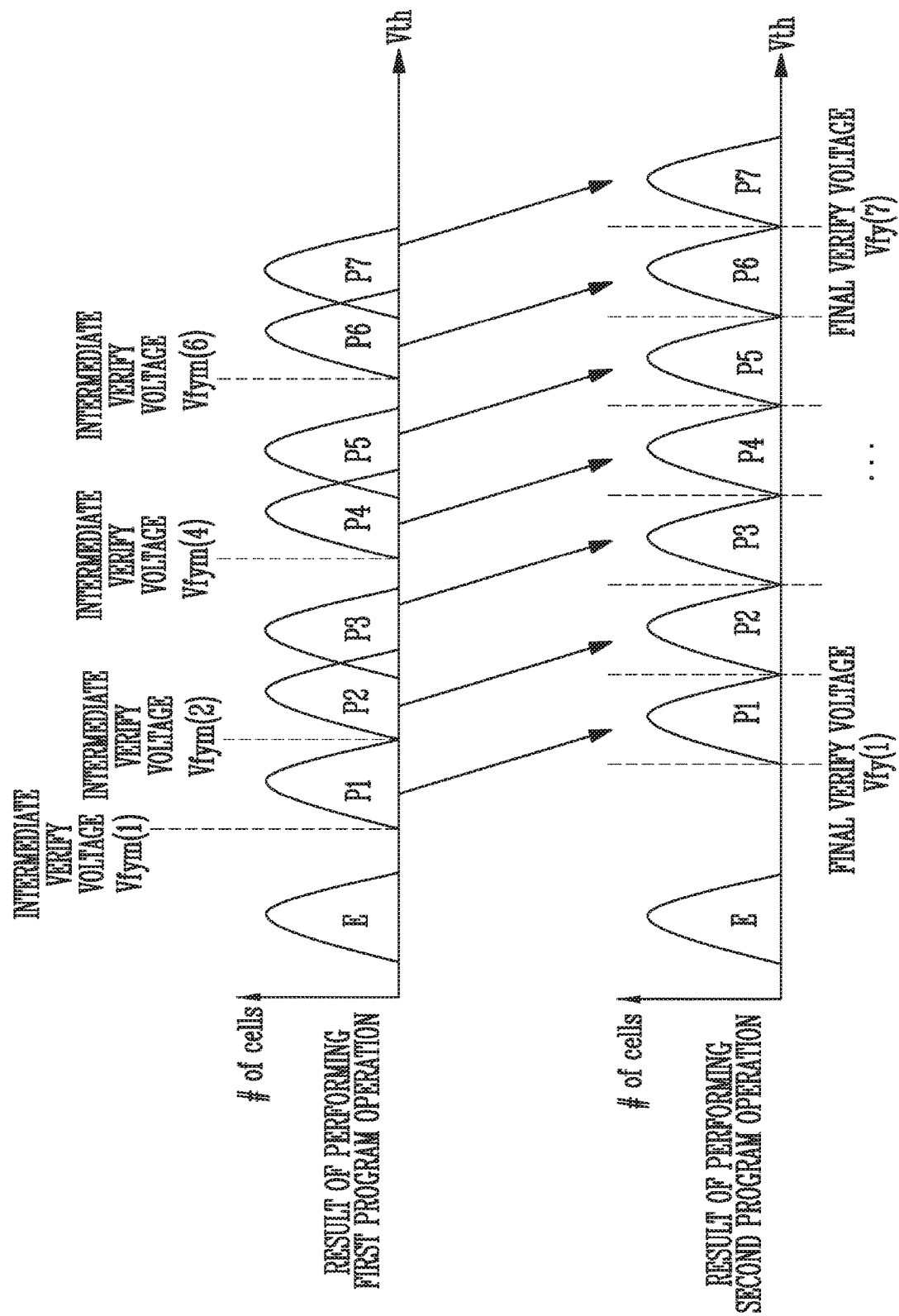
FIG. 7 is a diagram illustrating variation in threshold voltage distribution of memory cells during a program operation in accordance with an embodiment of the present disclosure.

FIG. 7 is a diagram illustrating variation in threshold voltage distribution of memory cells during a program operation in accordance with an embodiment of the present disclosure.

Referring to FIG. 7, a program operation may be performed on the memory cells such that each of the memory cells has a threshold voltage corresponding to any one state of an erase state E and first to seventh program states P1 to P7.

A first program operation may include an intermediate program operation and an additional program operation.

The intermediate program operation may be performed on memory cells having the first program state P1, the second program state P2, and the third program state P3 as target program states so that each of the memory cells has a threshold voltage greater than an intermediate verify voltage Vfym(1). The intermediate program operation may be performed on memory cells having the second program state P2 and the third program state P3 as target program states so that each of the memory cells has a threshold voltage greater than an intermediate verify voltage Vfym(2). The intermediate program operation may be performed on memory cells having the fourth program state P4 and the fifth program state P5 as target program states so that each of the memory cells has a threshold voltage greater than an intermediate verify voltage Vfym(4). The intermediate program operation may be performed on memory cells having the sixth program state P6 and the seventh program state P7 as target program states so that each of the memory cells has a threshold voltage greater than an intermediate verify voltage Vfym(6).

The additional program operation may be performed on memory cells having, as target program states, the third program state P3, the fifth program state P5, and the seventh program state P7 that correspond to higher threshold voltage distributions among adjacent threshold voltage distributions. Therefore, a threshold voltage distribution of memory cells after the additional program operation has been performed may have the same form as a result of performing the first program operation of FIG. 7.

The second program operation may be performed such that each of the memory cells has a threshold voltage corresponding to a target program state. The memory cells having the first program state P1 as a target program state may have a threshold voltage greater than a final verify voltage Vfy(1). The memory cells having the second program state P2 as a target program state may have a threshold voltage greater than a final verify voltage Vfy(2). Likewise, the memory cells having the third to seventh program states P3 to P7 as target program states may have threshold voltages greater than final verify voltages Vfy(3) to Vfy(7), respectively.

Figure 8:
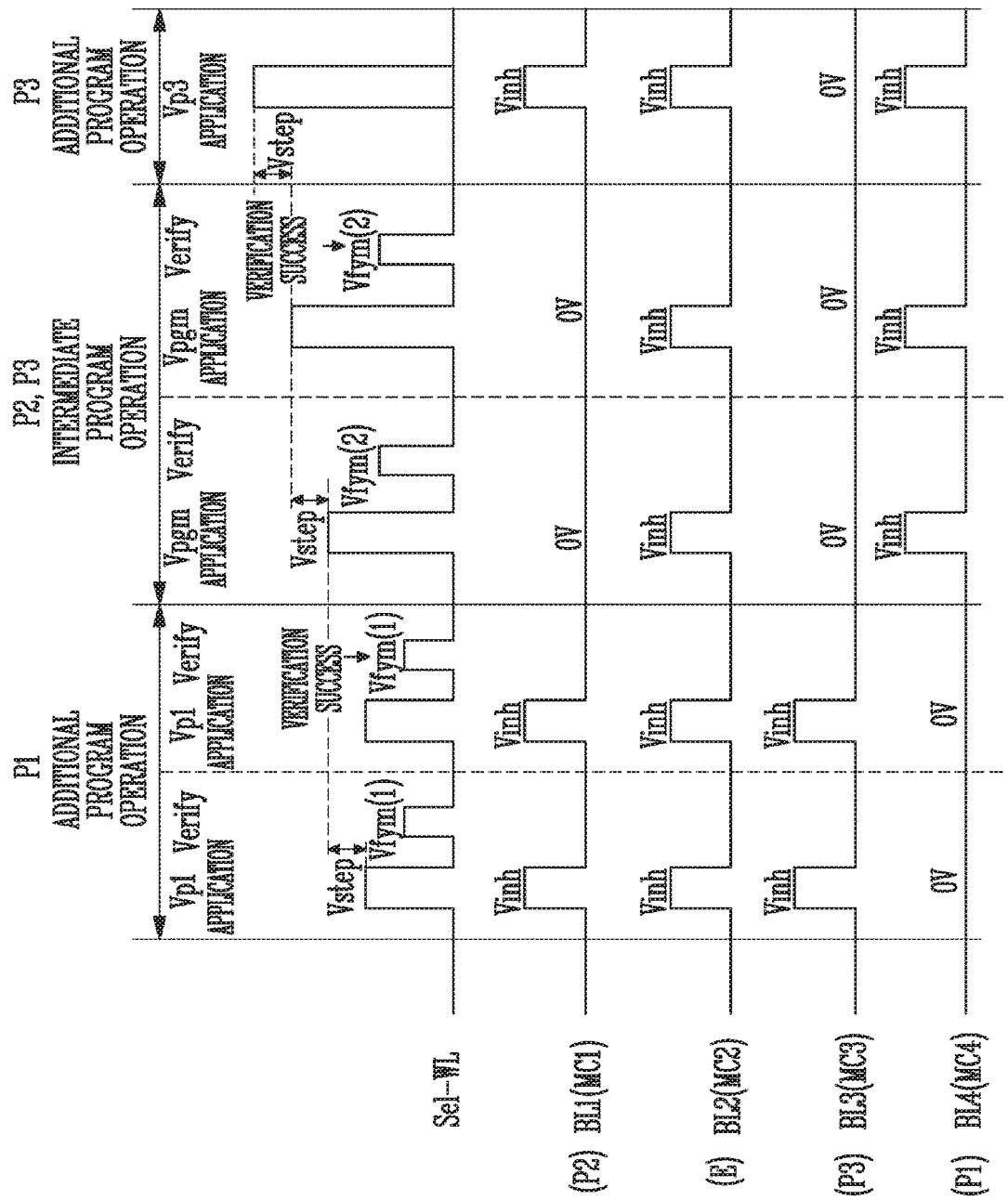
FIG. 8 is a diagram illustrating voltages to be applied during a first program operation in accordance with an embodiment of the present disclosure.

FIG. 8 is a diagram illustrating voltages to be applied during a first program operation in accordance with an embodiment of the present disclosure.

In FIG. 8, it is assumed that a first memory cell MC1 coupled to a first bit line BL1 has a second program state P2 as a target program state, a second memory cells MC2 coupled to a second bit line BL2 has an erase state E as a target program state, a third memory cells MC3 coupled to a third bit line BL3 has a third program state P3 as a target program state, and a fourth memory cells MC4 coupled to a fourth bit line BL4 has a first program state P1 as a target program state. First, an additional program operation is performed on memory cells having the first program state P1 as a target program state (during a P1 additional program operation). An additional program voltage Vp1 is applied to a selected word line Sel-WL. Since the fourth memory cell MC4 coupled to the fourth bit line BL4 has the first program state P1 as a target program state, a program enable voltage of 0 V may be applied to the fourth bit line BL4. A program inhibit voltage Vinh may be applied to the other bit lines BL1 to BL3.

Thereafter, an intermediate verify voltage Vfym(1) may be applied to the selected word line Sel-WL. The memory device may perform an intermediate verify operation of sensing a voltage or current of the fourth bit line BL4 and determining whether the P1 additional program operation of the fourth memory cell MC4 has been completed. If the intermediate verify operation fails, a subsequent program loop may be performed.

A program voltage increased by a step voltage Vstep compared to Vp1 applied during the preceding program loop may be applied to the selected word line Sel-WL. Subsequently, the intermediate verify voltage Vfym(1) may be applied to the selected word line Sel-WL. The memory device may sense the voltage or current of the fourth bit line BL4 and determine whether the threshold voltage of the fourth memory cell MC4 has exceeded the intermediate verify voltage Vfym(1). It is assumed that a verify operation has passed during the second program loop.

In an embodiment, a verify operation may be omitted during an additional program operation.

Subsequently, an intermediate program operation may be performed on memory cells having the second program state P2 and the third program state P3 as target program states (during a P2 and P3 intermediate program operation).

A program voltage Vpgm increased by a step voltage Vstep compared to Vp1 may be applied to the selected word line Sel-WL. A program enable voltage 0V may be applied to the first bit line BL1 and the third bit line BL3 that are coupled with the memory cells having the second program state P2 and the third program state P3 as target program states. A program inhibit voltage Vinh may be applied to the other bit lines BL2 and BL4. Thereafter, an intermediate verify voltage Vfym(2) may be applied to the selected word line Sel-WL. The memory device may perform an intermediate verify operation of sensing voltages or currents of the first bit line BL1 and the third bit line BL3 and determining whether the intermediate program operation for the first memory cell MC1 and the third memory cell MC3 has been completed. If the intermediate verify operation fails, a subsequent program loop may be performed.

A program voltage Vpgm increased by a step voltage Vstep compared to the program voltage applied during the preceding program loop may be applied to the selected word line Sel-WL. Thereafter, an intermediate verify voltage Vfym(2) is applied to the selected word line Sel-WL, and the memory device may determine whether the threshold voltages of the first memory cell MC1 and the third memory cell MC3 have exceeded the intermediate verify voltage Vfym(2). It is assumed that a verify operation has passed during the second program loop.

Thereafter, an additional program operation for the third program state P3 may be performed (during a P3 additional program operation).

An additional program voltage Vp3 is applied to a selected word line Sel-WL. Since the third memory cell MC3 coupled to the third bit line BL3 has the third program state P3 as a target program state, a program enable voltage of 0 V may be applied to the third bit line BL3. A program inhibit voltage Vinh may be applied to the other bit lines BL1, BL2, and BL4.

Likewise, an intermediate program operation for the fourth to seventh program states and an additional program operation for the fifth program state and the seventh program state may be performed (not illustrated).

In an embodiment, a verify operation may be omitted during an additional program operation.

In FIG. 8, it is assumed that the fourth memory cell MC4 coupled to the fourth bit line BL4 is a memory cell on which the additional program operation is to be performed, and the first memory cell MC1 and the third memory cell MC3 that are respectively coupled to the first bit line BL1 and the third bit line BL3 are memory cells on which the intermediate program operation is to be performed. However, the present invention is not limited to the illustrated embodiment. The intermediate program operation may be performed both on the fourth memory cell MC4 coupled to the fourth bit line BL4 and on the first memory cell MC1 coupled to the first bit line BL1 so that each of the fourth memory cell MC4 and the first memory cell MC1 has a threshold voltage greater than the intermediate verify voltage Vfym(1). The intermediate program operation may be performed both on the third memory cell MC3 coupled to the third bit line BL3 and on a memory cell (not illustrated) coupled to another bit line and having the fourth program state as a target program state so that each the third memory cell MC3 and the memory cell having the fourth program state as a target program state has a threshold voltage greater than the intermediate verify voltage Vfym(3) (not illustrated). Alternatively, in FIG. 8, the intermediate program operation may be performed on the first memory cell MC1, the third memory cell MC3, and the fourth memory cell MC4 that are respectively coupled to the first bit line BL1, the third bit line BL3, and the fourth bit line BL4 so that each of the first memory cell MC1, the third memory cell MC3, and the fourth memory cell MC4 has a threshold voltage greater than the intermediate verify voltage Vfym(1).

Figure 9:
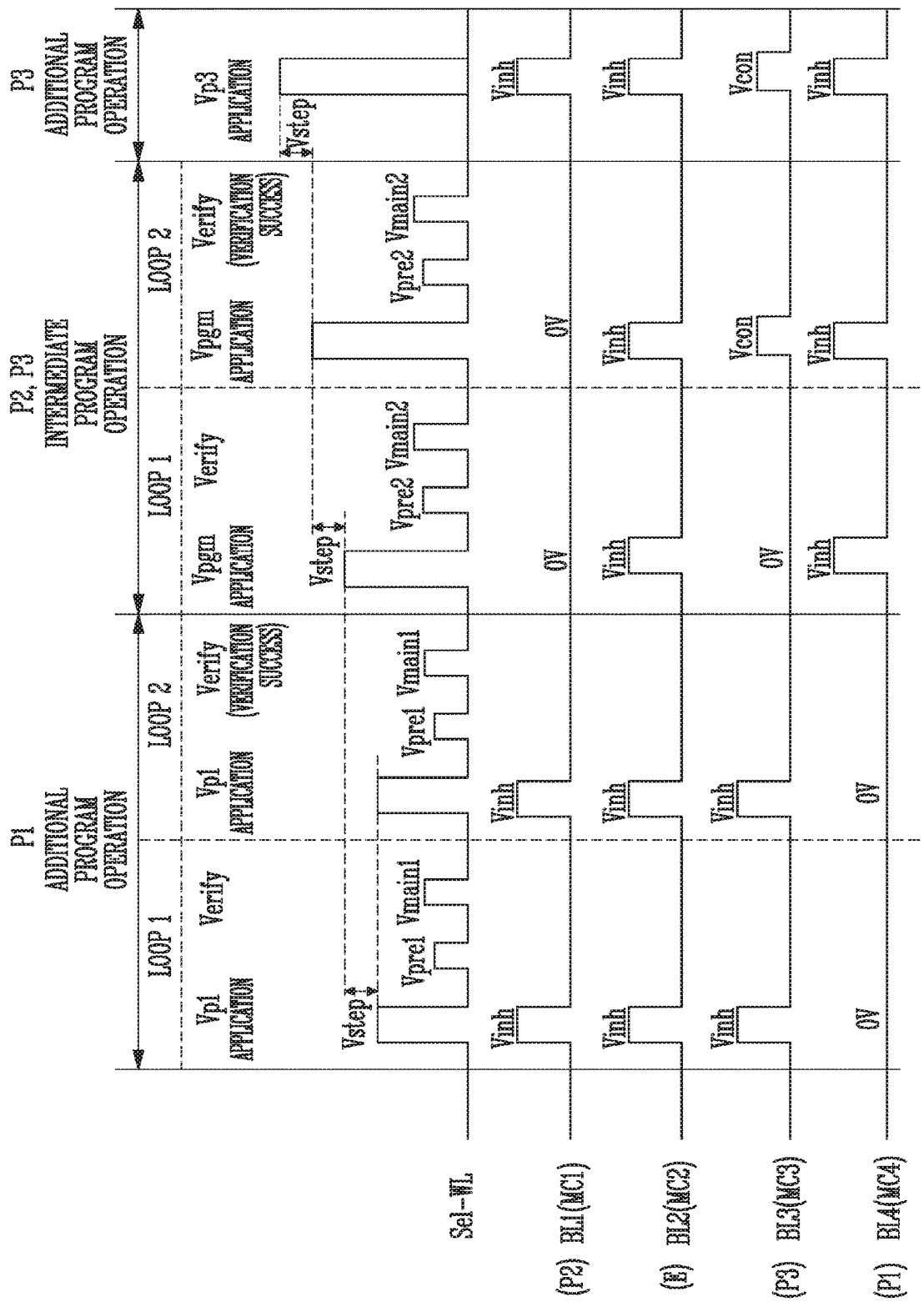
FIG. 9 is a diagram illustrating voltages to be applied during a first program operation in accordance with an embodiment of the present disclosure.

FIG. 9 is a diagram illustrating voltages to be applied during a first program operation in accordance with an embodiment of the present disclosure.

In the embodiment of FIG. 9, unlike the embodiment of FIG. 8, an intermediate program operation is performed in a DPGM scheme using two verify voltages.

First, an additional program operation is performed on memory cells having the first program state P1 as a target program state (during a P1 additional program operation). An additional program voltage Vp1 is applied to a selected word line Sel-WL. Since the fourth memory cell MC4 coupled to the fourth bit line BL4 has the first program state P1 as a target program state, a program enable voltage of 0 V may be applied to the fourth bit line BL4. A program inhibit voltage Vinh may be applied to the other bit lines BL1 to BL3. Thereafter, a pre-verify voltage Vpre1 and a main verify voltage Vmain1 may be sequentially applied to the selected word line Sel-WL. The memory device may determine whether the threshold voltage of the fourth memory cell MC4 that is a memory cell on which the P1 additional program operation is performed is less than the pre-verify voltage Vpre1, corresponds to a range between the pre-verify voltage Vpre1 and the main verify voltage Vmain1, or is greater than the main verify voltage Vmain1.

It is assumed that, as a result of performing the intermediate verify operation, the threshold voltage of the fourth memory cell MC4 has been determined to be less than the pre-verify voltage Vpre1.

During a subsequent program loop (LOOP 2), a program voltage Vpgm increased by a step voltage Vstep compared to the program voltage applied during the preceding program loop (LOOP 1) may be applied to the selected word line Sel-WL. A program enable voltage of 0V may be applied to the fourth bit line BL4 coupled with the fourth memory cell MC4 that has been determined to have a threshold voltage less than the pre-verify voltage Vpre1 during the preceding program loop (LOOP 1). Thereafter, a pre-verify voltage Vpre1 and a main verify voltage Vmain1 may be sequentially applied to the selected word line Sel-WL. The memory device may determine whether the threshold voltage of the fourth memory cell MC4, that is, a memory cell on which the P1 additional program operation is performed, is less than the pre-verify voltage Vpre1, corresponds to a range between the pre-verify voltage Vpre1 and the main verify voltage Vmain1, or is greater than the main verify voltage Vmain1. It is assumed that during the second program loop (LOOP 2) the threshold voltage of the fourth memory cell MC4 has been determined to be greater than the main verify voltage Vmain1.

In an embodiment, a verify operation may be omitted during an additional program operation.

Subsequently, an intermediate program operation may be performed on memory cells having the second program state P2 and the third program state P3 as target program states (during a P2 and P3 intermediate program operation).

A program voltage Vpgm increased by a step voltage Vstep compared to Vp1 may be applied to the selected word line Sel-WL. A program enable voltage 0V may be applied to the first bit line BL1 and the third bit line BL3 that are coupled with the memory cells having the second program state P2 and the third program state P3 as target program states. A program inhibit voltage Vinh may be applied to the other bit lines BL2 and BL4. Thereafter, a pre-verify voltage Vpre2 and a main verify voltage Vmain2 may be sequentially applied to the selected word line Sel-WL. The memory device may determine whether the threshold voltage of each of the first memory cell MC1 and the third memory cell MC3 that are memory cells on which the intermediate program operation is performed is less than the pre-verify voltage Vpre2, corresponds to a range between the pre-verify voltage Vpre2 and the main verify voltage Vmain2, or is greater than the main verify voltage Vmain2.

It is assumed that as a result of performing the intermediate verify operation the threshold voltage of the first memory cell MC1 is determined to be less than the pre-verify voltage Vpre2, and the threshold voltage of the third memory cell MC3 is determined to be greater than the pre-verify voltage Vpre2 and less than the main verify voltage Vmain2.

During a subsequent program loop (LOOP 2), a program voltage Vpgm increased by a step voltage Vstep compared to the program voltage applied during the preceding program loop (LOOP 1) may be applied to the selected word line Sel-WL. A program enable voltage of 0V may be applied to the first bit line BL1 coupled with the first memory cell MC1 that has been determined to have a threshold voltage less than the pre-verify voltage Vpre2 during the preceding program loop (LOOP 1). A program control voltage Vcon may be applied to the third bit line BL3 coupled to the third memory cell MC3 that has been determined to have a threshold voltage greater than the pre-verify voltage Vpre2 and less than the main verify voltage Vmain2 during the preceding loop. In an embodiment, the level of the program control voltage Vcon may be greater than the program enable voltage 0V and less than the program inhibit voltage Vinh.

Thereafter, a pre-verify voltage Vpre2 and a main verify voltage Vmain2 are successively applied to the selected word line Sel_WL, and the memory device may determine whether the threshold of each of the first memory cell MC1 and the third memory cell MC3 is less than the pre-verify voltage Vpre2, corresponds to a range between the pre-verify voltage Vpre2 and the main verify voltage Vmain2, or is greater than the main verify voltage Vmain2. It is assumed that during the second program loop (LOOP 2) the threshold voltage of each of the first memory cell MC1 and the third memory cell MC3 has been determined to be greater than the main verify voltage Vmain2.

Thereafter, an additional program operation for the third program state P3 may be performed (during a P3 additional program operation).

An additional program voltage Vp3 is applied to a selected word line Sel-WL. A program control voltage Vcon that was applied during the loop 2 may be re-applied to the third bit line BL3 coupled with the third memory cell MC3. A program inhibit voltage Vinh may be applied to the other bit lines BL1, BL2, and BL4.

Likewise, an intermediate program operation for the fourth to seventh program states and an additional program operation for the fifth program state and the seventh program state may be performed (not illustrated).

In an embodiment of FIG. 9, when the additional program operation is performed, a program control voltage may be applied, in the same manner as that in the preceding program loop, to a bit line coupled with a memory cell to which the program control voltage was applied during the preceding program loop. Thereby, an overprogrammed state in which the threshold voltage of a memory cell is excessively increased through the additional program operation may be prevented.

Figure 10:
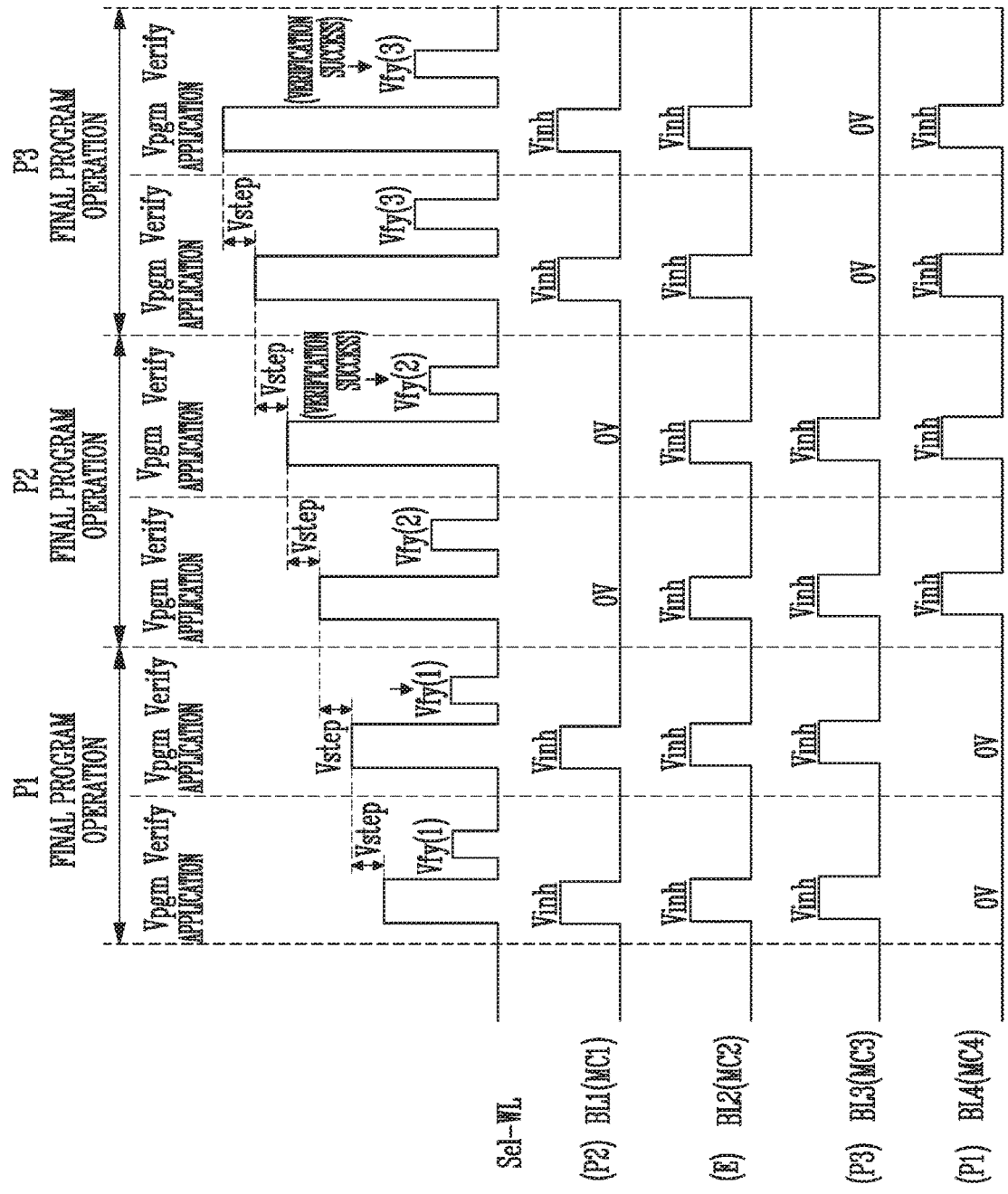
FIG. 10 is a diagram illustrating voltages to be applied during a second program operation in accordance with an embodiment of the present disclosure.

FIG. 10 is a diagram illustrating voltages to be applied during a second program operation in accordance with an embodiment of the present disclosure.

Referring to FIG. 10, the second program operation may increase the threshold voltages of memory cells so that the threshold voltage of each memory cell corresponds to any one of first to seventh program states P1 to P7.

The second program operation may be sequentially performed from a program state having a low threshold voltage to a program state having a high threshold voltage.

In FIG. 10, it is assumed that a first memory cell MC1 coupled to a first bit line BL1 has a second program state P2 as a target program state, a second memory cells MC2 coupled to a second bit line BL2 has an erase state E as a target program state, a third memory cells MC3 coupled to a third bit line BL3 has a third program state P3 as a target program state, and a fourth memory cells MC4 coupled to a fourth bit line BL4 has a first program state P1 as a target program state.

First, a final program operation for the first program state P1 may be performed. That is, a P1 final program operation is performed.

A program voltage Vpgm may be applied to the selected word line Sel-WL. A program enable voltage (i.e., 0V) is applied to the fourth bit line BL4 coupled to the fourth memory cell MC4. A program inhibit voltage Vinh may be applied to the other bit lines BL1 to BL3. Subsequently, a final verify voltage Vfy(1) corresponding to the first program state P1 may applied to the selected word line Sel-WL. The memory device may determine whether a verify operation has passed as a sensed result through the fourth bit line BL4. If the verify operation fails, a program voltage Vpgm increased by a step voltage Vstep compared to that of the preceding program loop may be applied to the selected word line Sel-WL. After the program voltage has been applied, a verify operation may be performed. The memory device may repeatedly perform a program voltage application operation and a verify operation until the verify operation passes.

If a verify operation using the final verify voltage Vfy(1) corresponding to the first program state P1 passes, a final program operation for the second program state P2 may be performed. That is, a P2 final program operation is performed.

The final program operation for each of the second program state P2 and the third program state P3 may be performed in the same manner as that of the first final program operation.

In an embodiment, the final program operation may be performed according to a DPGM scheme in the same manner as that of the embodiment described with reference to FIG. 8.

Figure 11:
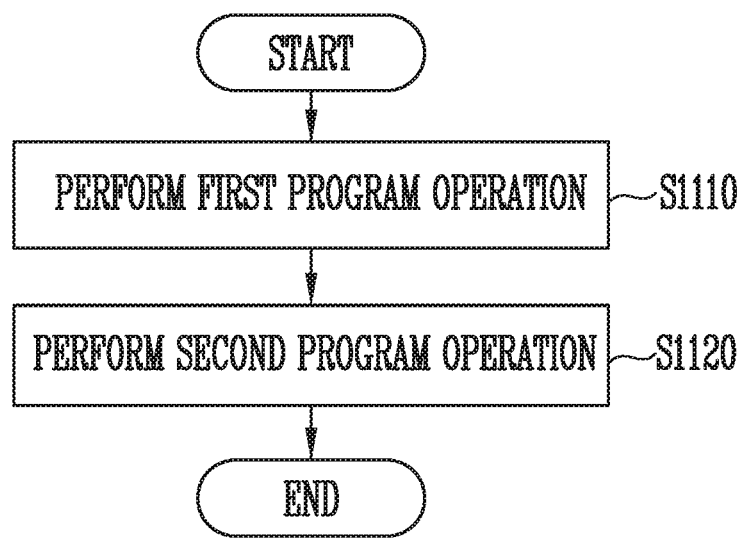
FIG. 11 is a flowchart illustrating a method of operating a memory device in accordance with an embodiment of the present disclosure.

FIG. 11 is a flowchart illustrating a method of operating a memory device in accordance with an embodiment of the present disclosure.

Referring to FIG. 11, at step S1110, the memory device may perform a first program operation on memory cells coupled to a selected word line. The first program operation may include an intermediate program operation and an additional program operation.

The intermediate program operation may be an operation of performing a program operation so that threshold voltages of memory cells having, as target program states, a first program state and a second program state which have adjacent threshold voltage distributions among a plurality of program states are included in a threshold voltage distribution corresponding to an intermediate program state.

The additional program operation may be an operation of applying an additional program voltage to memory cells having the second program state as a target program state among the memory cells having the first program state and the second program state as the target program states.

At step S1120, the memory device may perform a second program operation on the memory cells coupled to the selected word line. The second program operation may be a final program operation of increasing the threshold voltage so that each of the memory cells has a threshold voltage corresponding to a target program state.

Figure 12:
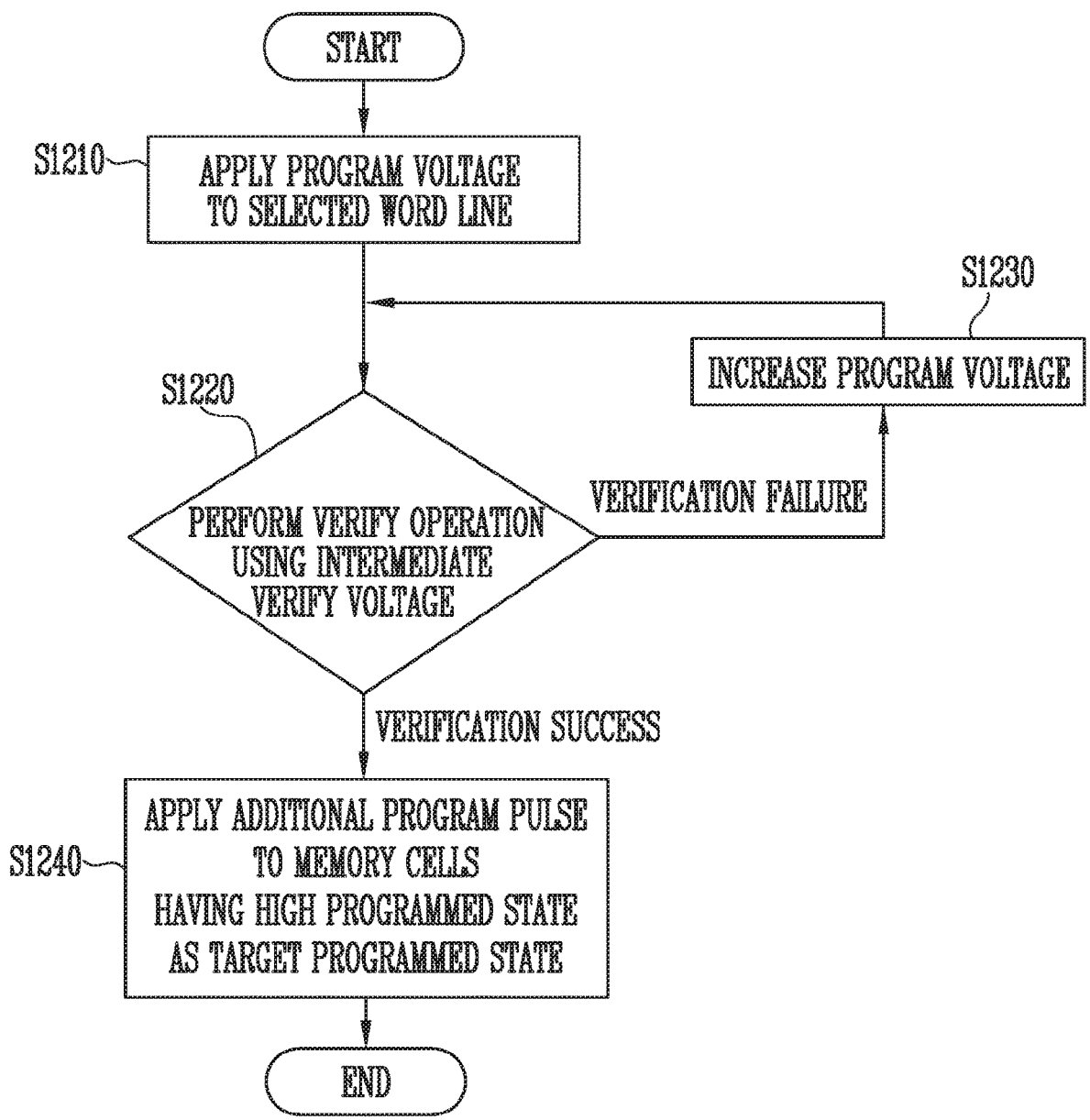
FIG. 12 is a flowchart illustrating in detail a first program operation of FIG. 11.

FIG. 12 is a flowchart illustrating in detail the first program operation of FIG. 11.

Referring to FIG. 12, at step S1210, the memory device may apply a program voltage to a selected word line. A program enable voltage may be applied to a bit line coupled to a memory cell to be programmed, and a program inhibit voltage may be applied to a bit line coupled to a memory cell not to be programmed.

At step S1220, the memory device may perform an intermediate verify operation using an intermediate verify voltage. In various embodiments, if the memory device performs a program operation in a DPGM scheme, the intermediate verify voltage may include pre-verify voltage and a main verify voltage.

For example, it is assumed that a first program operation is performed on memory cells having, as target program states, a first program state and a second program state, which have adjacent threshold voltage distributions, among a plurality of program states.

The intermediate verify voltage may be less than the final verify voltage of the first program state. As a result of the verification, if the verification succeeds, the process proceeds to step S1240, and if the verification fails, the process proceeds to step S1230.

At step S1230, the memory device may increase the program voltage and re-apply the increased program voltage to the selected word line. The level of the program voltage may increase by a step voltage compared to that of a preceding program voltage. At step S1240, an additional program operation may be performed. The memory device may perform the additional program operation of applying an additional program pulse to the memory cells having the second program state as a target program state. In an embodiment, a verify operation may be omitted during an additional program operation.

Figure 13:
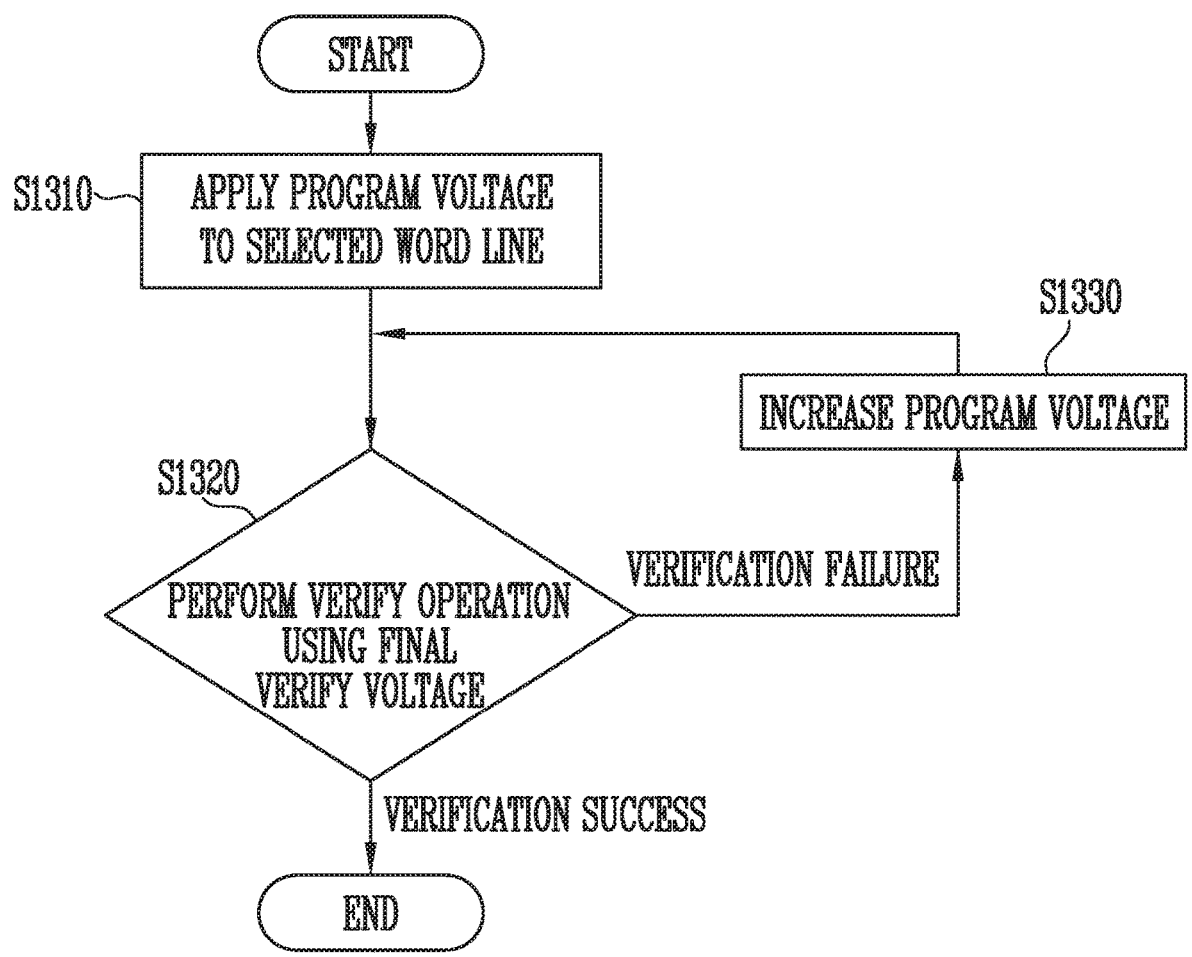
FIG. 13 is a flowchart illustrating in detail a second program operation of FIG. 11.

FIG. 13 is a flowchart illustrating in detail the second program operation of FIG. 11.

Referring to FIG. 13, at step S1310, the memory device may apply a program voltage to the selected word line. A program enable voltage may be applied to a bit line coupled to a memory cell to be programmed. A program inhibit voltage may be applied to a bit line coupled to a memory cell not to be programmed.

At step S1320, the memory device may perform a verify operation using a final verify voltage. In various embodiments, if the memory device performs a program operation in a DPGM scheme, the final verify voltage may include a pre-verify voltage and a main verify voltage. As a result of the verification, if the verification succeeds, the memory device may terminate the program operation. If the verification fails, the process may proceed to step S1330. Thus, the memory device may increase the program voltage and re-apply the increased program voltage to the selected word line.

Figure 14:
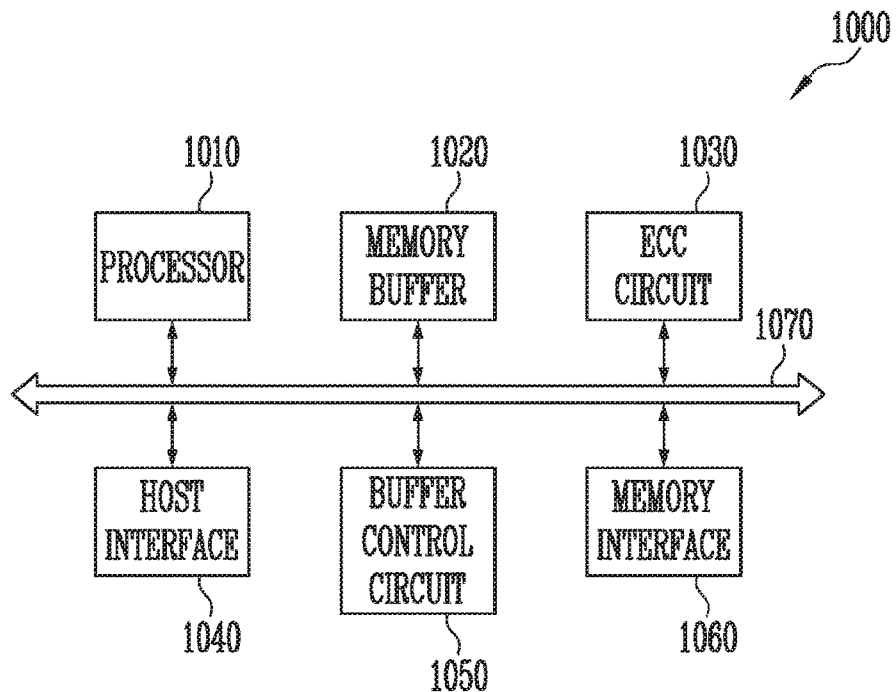
FIG. 14 is a diagram illustrating an embodiment of a memory controller of FIG. 1.

FIG. 14 is a diagram illustrating an embodiment of a memory controller of FIG. 1.

A memory controller 1000 is coupled to a host and a memory device. In response to a request from the host, the memory controller 1000 may access the memory device.

Referring to FIG. 14, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the storage device by using the memory buffer 1020 as an operating memory, a cache memory, or a buffer memory.

The processor 1010 may perform the function of a flash translation layer (FTL). The processor 1010 may randomize data received from the host. For example, the processor 1010 may use a randomizing seed to randomize data received from the host. Randomized data may be provided to the memory device as data to be stored, and may be programmed to the memory cell array.

During a read operation, the processor 1010 may derandomize data received from the memory device. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

The memory buffer 1020 may be used as an operating memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and/or a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device through the channel.

In an embodiment, the memory controller 1000 may include neither the memory buffer 1020 nor the buffer control circuit 1050. Either or both of these components may be provided separately, or the functions of one or both may be integrated into the memory controller 1000.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and neither may interfere with nor affect the other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 15:
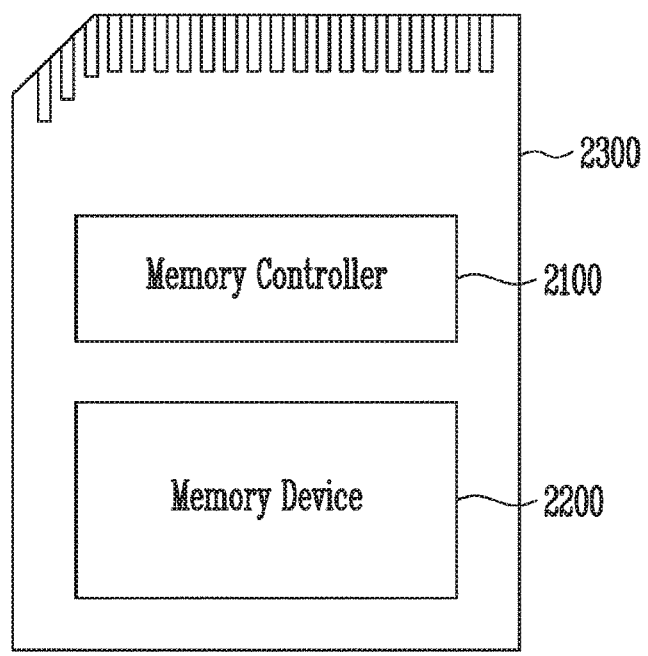
FIG. 15 is a block diagram illustrating a memory card system to which a storage device including a memory device is applied in accordance with an embodiment of the present disclosure.

FIG. 15 is a block diagram illustrating a memory card system 2000 to which a storage device including a memory device is applied in accordance with an embodiment of the present disclosure.

Referring FIG. 15, the memory card system 2000 may include a memory controller 2100, a memory device 2200 and a connector 2300.

The memory controller 2100 is coupled to the memory device 2200. The memory controller 2100 may access the memory device 2200. The memory controller 2100 may be embodied in the same manner as that of the memory controller 200 described with reference to FIG. 1.

In an embodiment, the memory controller 2100 may include components such as a random access memory (RAM), a processing unit, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols, such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and/or nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin-torque magnetic RAM (STT-MRAM).

For example, the memory controller 2100 or the memory device 2200 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP). Alternatively, the memory device 2200 may include a plurality of nonvolatile memory chips, and the plurality of nonvolatile memory chips may be packaged based on any of the above-mentioned package methods and provided as a single semiconductor package.

For example, the memory controller 2100 and the memory device 2200 may be integrated into a single semiconductor device. In an embodiment, the memory controller 2100 and the memory device 2200 may be integrated into a single semiconductor device to form a solid state drive (SSD). In another embodiment, the memory controller 2100 and the memory device 2200 may be integrated into a single semiconductor device to form a memory card, such as a personal computer memory card international association (PCMCIA), a compact flash card (CF), a smart media card (e.g., SM or SMC), a memory stick, a multimedia card (e.g., MMC, RS-MMC, or MMCmicro), a secure digital (SD) card (e.g., SD, miniSD, microSD, or SDHC), or a universal flash storage (UFS).

For example, the memory device 2200 may be a memory device 100 described with reference to FIG. 2.

Figure 16:
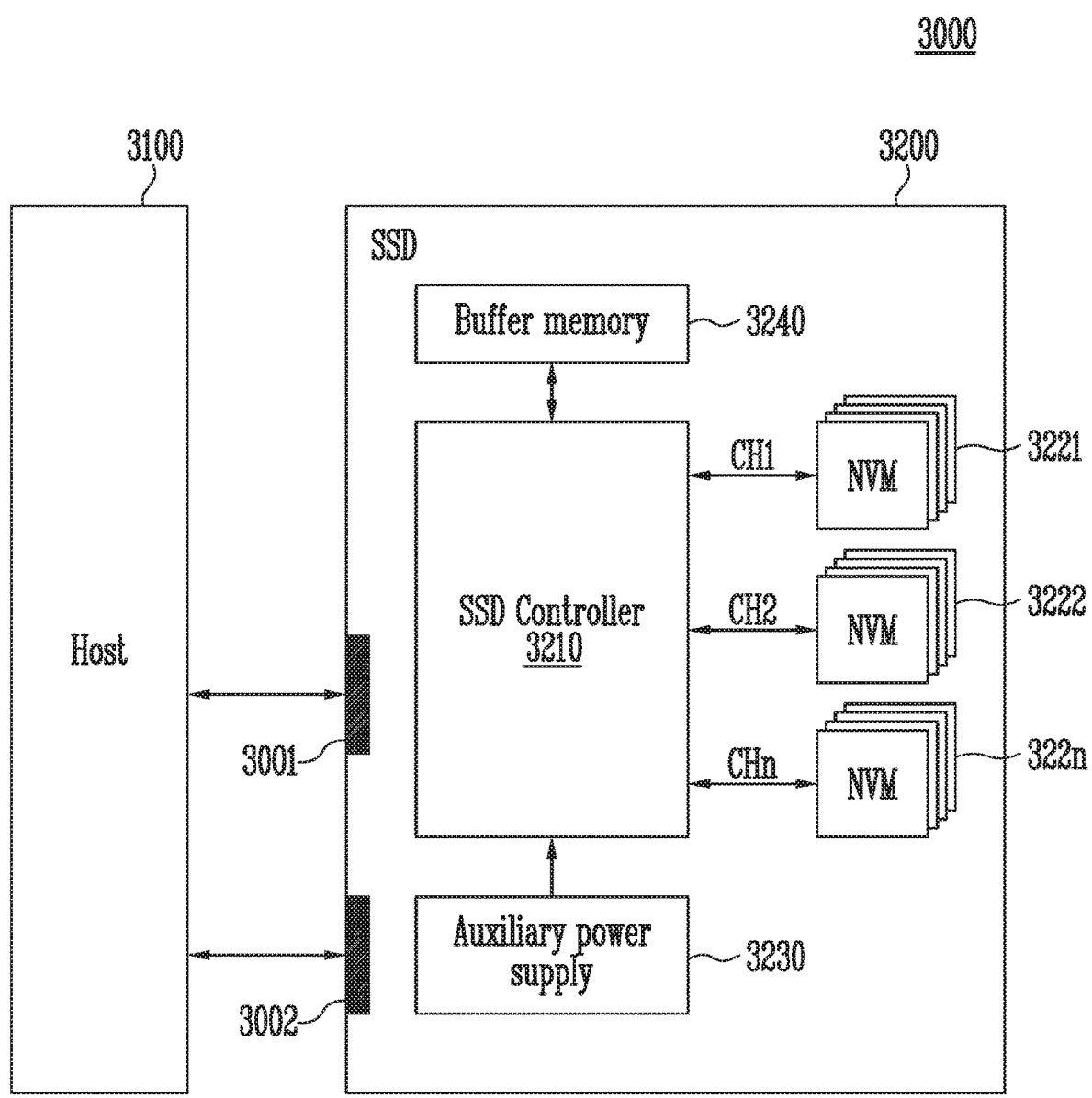
FIG. 16 is a block diagram illustrating a solid state drive (SSD) system to which a storage device including a memory device is applied in accordance with an embodiment of the present disclosure.

FIG. 16 is a block diagram illustrating a solid state drive (SSD) system 3000 to which a storage device including a memory device is applied in accordance with an embodiment of the present disclosure.

Referring to FIG. 16, the SSD system 3000 may include a host 3100 and an SSD 3200. The SSD 3200 may exchange signals SIG with the host 3100 through a signal connector 3001 and may receive powerPWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be based on an interface between the host 3100 and the SSD 3200. For example, the signals SIG may be defined by at least one of various interfaces, such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), wireless fidelity (Wi-Fi), Bluetooth, and/or nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned within or externally to the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

For example, each of the nonvolatile memory devices 3221 to 322n may be the memory device 100 described with reference to FIG. 2.

Figure 17:
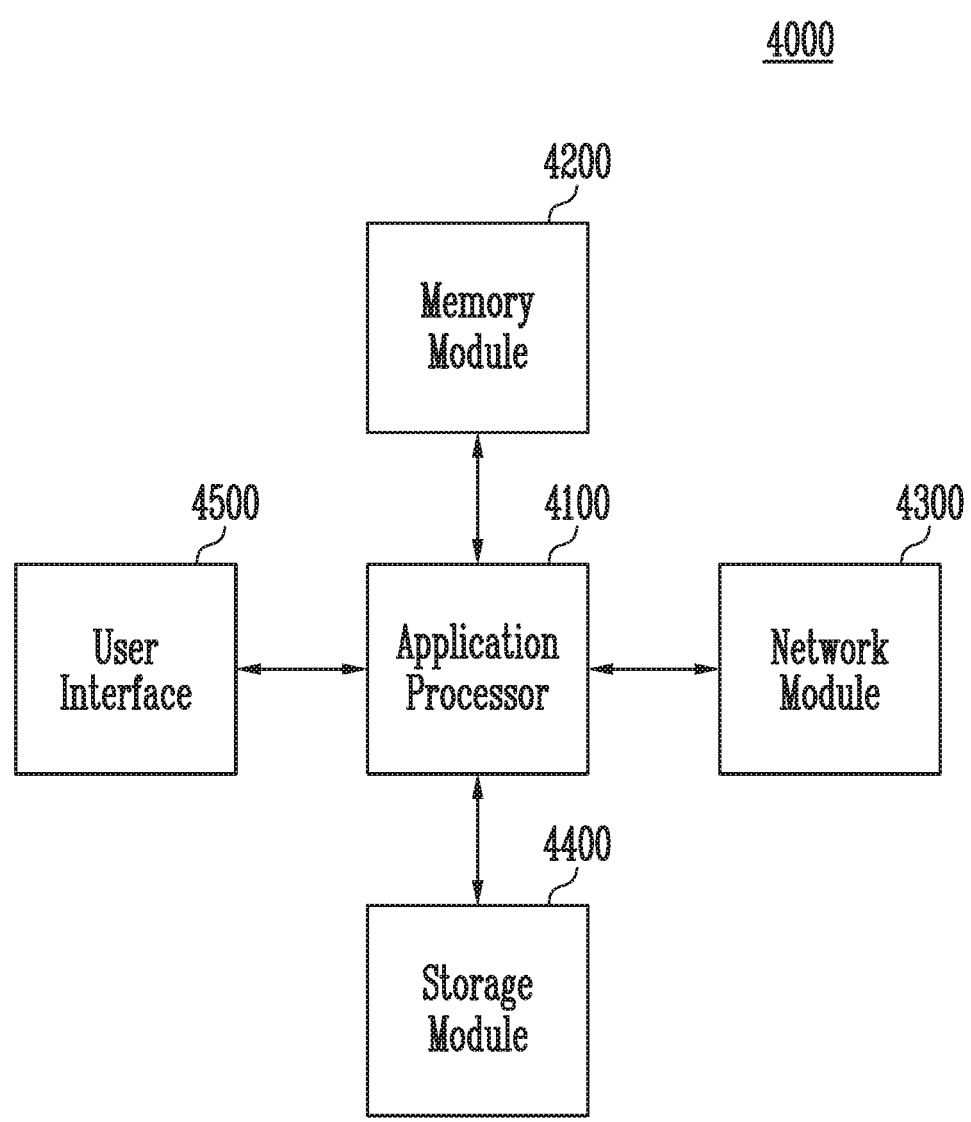
FIG. 17 is a block diagram illustrating a user system to which a storage device including a memory device is applied in accordance with an embodiment of the present disclosure.

FIG. 17 is a block diagram illustrating a user system 4000 to which a storage device including a memory device is applied in accordance with an embodiment of the present disclosure.

Referring to FIG. 17, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be the memory device 100 described above with reference to FIG. 2.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a liquid crystal display (LCD), an organic light emitting diode (OLED) display device, an active matrix OLED (AMOLED) display device, an LED, a speaker, and a motor.

Various embodiments of the present disclosure may provide a memory device having enhanced reliability, and a method of operating the memory device.

Although embodiments of the present invention have been disclosed, those skilled in the art will appreciate in light of the present disclosure that various modifications, additions and substitutions are possible, without departing from the scope and spirit of the present disclosure.

Therefore, the scope of the present disclosure defined by the appended claims and their equivalents rather than by the description preceding them.

In the above-discussed embodiments, some steps, depending on context, may be selectively performed or skipped. In addition, certain steps may not be always performed in regular order. Furthermore, the embodiments disclosed herein aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

In the above description, specific terms or words used should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A method of operating a memory device configured to perform a program operation of storing data in memory cells each having, as a target programmed state, any one programmed state of a first programmed state and a second programmed state that are adjacent to each other among a plurality of programmed states, the method comprising:
    performing an intermediate program operation on the memory cells using an intermediate verify voltage having a voltage level less than a verify voltage corresponding to the first program state;
    performing an additional program operation of applying an additional program voltage to memory cells each having the second program state among the memory cells; and
    performing a final program operation for the memory cells to have a threshold voltage corresponding to a target program state,
    wherein a threshold voltage of a memory cell corresponding to the first program state is less than a threshold voltage of a memory cell corresponding to the second program state, and
    wherein the performing of the additional program operation comprises:
    applying the additional program voltage to a word line to which the memory cells are coupled in common; and
    applying, while the additional program voltage is applied, a program inhibit voltage to bit lines coupled to memory cells each having the first program state among the memory cells, and a program enable voltage to bit lines coupled to memory cells each having the second program state among the memory cells.

2. The method according to claim 1, wherein the additional program voltage is greater than a program voltage by a set step voltage, the program voltage applied to the memory cells when the intermediate verify operation passes.

3. The method according to claim 1, wherein the program enable voltage is a ground voltage.

4. The method according to claim 1, wherein the program inhibit voltage is a power supply voltage.

5. The method according to claim 1, wherein the intermediate verify voltage includes a pre-verify voltage and a main verify voltage greater than the pre-verify voltage.

6. The method according to claim 5, wherein the performing of the intermediate program operation comprises:
    applying a program enable voltage to bit lines coupled to memory cells each having a threshold voltage less than the pre-verify voltage among the memory cells, applying a program control voltage to bit lines coupled to memory cells each having a threshold voltage greater than the pre-verify voltage and less than the main verify voltage among the memory cells, and applying a program inhibit voltage to bit lines coupled to memory cells each having a threshold voltage greater than the main verify voltage among the memory cells.

7. The method according to claim 6, wherein the program control voltage includes a voltage greater than the program enable voltage and less than the program inhibit voltage.

8. The method according to claim 6, wherein the performing of the additional program operation comprises:
    applying, while the additional program voltage is applied, the program control voltage to the bit lines coupled to the memory cells to which the program control voltage has been applied during the intermediate program operation among the memory cells each having the second program state as the target program state.

9. The method according to claim 1, wherein the program operation is performed in an incremental step pulse program (ISPP) manner.

10. A method of operating a memory device configured to perform a program operation of storing data in memory cells each having any one programmed state among a plurality of programmed states as a target programmed state, the method comprising:
    performing an intermediate program operation for the memory cells to have threshold voltages corresponding to a plurality of intermediate program states for every two program states having adjacent threshold voltage distributions among the plurality of program states;
    performing an additional program operation of applying an additional program voltage to memory cells each having a program state of the two program states that corresponds to a high threshold voltage distribution; and performing a final program operation for the memory cells to have the threshold voltages corresponding to target programmed states, respectively.

11. The method according to claim 10, wherein each of intermediate verify voltages corresponding to the plurality of intermediate program states has a voltage level less than final verify voltages of a program state of the two program states that corresponds to a low threshold voltage distribution.

12. The method according to claim 11, wherein each of the intermediate verify voltages includes a pre-verify voltage and a main verify voltage greater than the pre-verify voltage.

13. The method according to claim 10, wherein the additional program voltage has a level increased by a set step voltage compared to a program voltage applied when the intermediate program operation is completed.

14. A memory device comprising:

a plurality of memory cells each having any one of a first program state and a second program state that are adjacent to each other among a plurality of program states;

a peripheral circuit configured to perform a program operation for each of the plurality of memory cells to have a threshold voltage corresponding to a target program state; and a control circuit configured to control the peripheral circuit, wherein the control circuit comprises:

a program operation controller configured to control the peripheral circuit, during the program operation, to perform an intermediate program operation on the memory cells using an intermediate verify voltage having a voltage level less than a verify voltage corresponding to the first program state, to perform an additional program operation on memory cells each having the second program state among the memory cells if an intermediate verify operation using the intermediate verify voltage passes, and to perform a final program operation on the memory cells such that each of the memory cells has a threshold voltage corresponding to a target program state.

15. The memory device according to claim 14, wherein the additional program voltage is greater than a program voltage by a set step voltage, the program voltage applied to the memory cells when the intermediate operation passes.

16. The memory device according to claim 14, wherein, while the additional program voltage is applied, the program operation controller controls the peripheral circuit to apply a program inhibit voltage to bit lines coupled to memory cells each having the first program state among the memory cells, and apply a program enable voltage to bit lines coupled to memory cells each having the second program state among the memory cells.

17. The memory device according to claim 16, wherein the program enable voltage is a ground voltage.

18. The memory device according to claim 16, wherein the program inhibit voltage is a power supply voltage.

19. The memory device according to claim 14, wherein the intermediate verify voltage includes a pre-verify voltage and a main verify voltage greater than the pre-verify voltage.

* * * * *